United States Patent

Noda et al.

[11] Patent Number: 5,970,001
[45] Date of Patent: Oct. 19, 1999

[54] DYNAMIC RAM PROVIDED WITH A DEFECT RELIEF CIRCUIT

[75] Inventors: Hiromasa Noda, Tokyo; Kenji Nishimoto, Urawa; Yoshitaka Kinoshita, Akishima; Masakazu Aoki, Tokorozawa, all of Japan

[73] Assignee: Hitachi, Ltd., Tokyo, Japan

[21] Appl. No.: 09/035,267

[22] Filed: Mar. 5, 1998

[30] Foreign Application Priority Data

Mar. 24, 1997 [JP] Japan ................................. 9-088949

[51] Int. Cl.$^6$ ........................................................ G11C 7/00
[52] U.S. Cl. ................................. 365/200; 365/189.07
[58] Field of Search ............................... 365/200, 189.07

[56] References Cited

U.S. PATENT DOCUMENTS 5,835,436  11/1998  Ooishi ........................... 365/230.03

Primary Examiner—David Nelms
Assistant Examiner—M. Tran
Attorney, Agent, or Firm—Antonelli, Terry, Stout & Kraus, LLP

[57] ABSTRACT

An X address buffer for generating an internal address signal by capturing an X address signal input from an address terminal is brought into an operating state before an external control clock is input. A redundancy address comparator for detecting a match/mismatch signal by comparing the generated internal address signal with a stored X-system defective address is used as a static circuit. Thereby, the redundancy address comparator starting operation is accelerated and as a result, acceleration of the reading operation is achieved.

22 Claims, 15 Drawing Sheets

DYNAMIC RAM PROVIDED WITH A DEFECT RELIEF CIRCUIT

BACKGROUND OF THE INVENTION

The present invention relates to a dynamic RAM (Random Access Memory), particularly to a technique effectively used as a defect relief technique for a synchronous DRAM.

A redundant circuit of a dynamic RAM is disclosed in Japanese Patent Laid-Open Nos. 64-76597/1989, 4-286798/1992, 7-282597/1995, 7-105697/1995, and 9-128993/1997.

A dynamic RAM provided with a defect relief circuit for switching a defective word line to a redundant word line determines whether an input address signal indicates a defective address. When an access is to a defective word line, the selecting operation on the normal circuit side is inhibited so as to select a redundant word line. Therefore, the time taken to select a normal word line having no defect is wasted. The same holds true for the case where a word line having no detect is selected, because a decision that the address signal is not indicative of a defective address is necessary in accordance with the comparison result of the defective address as a condition of the selecting operation of the normal word line.

SUMMARY OF THE INVENTION

The inventor of this invention has proposed the use of an address-signal setup time in order to eliminate the operation delay due to the comparison of the defective address.

It is an object of the present invention to provide a dynamic RAM which is capable of realizing a high-speed operation, while having a defect relief function. The above and other objects and novel features of the present invention will become more apparent from the description of provided in this specification and from the accompanying drawings.

The outline of a representative feature of the invention disclosed in this application will be briefly described below. That is, in the case of a synchronous DRAM, a static circuit is used as an X address buffer for generating an internal address signal by capturing an X address signal input from an address terminal. Moreover, a static circuit is used as a comparator for comparing the generated internal address signal with a stored X-system defective address to detect a matching/mismatching signal.

DETAILED DESCRIPTION OF THE INVENTION

Figure 1:
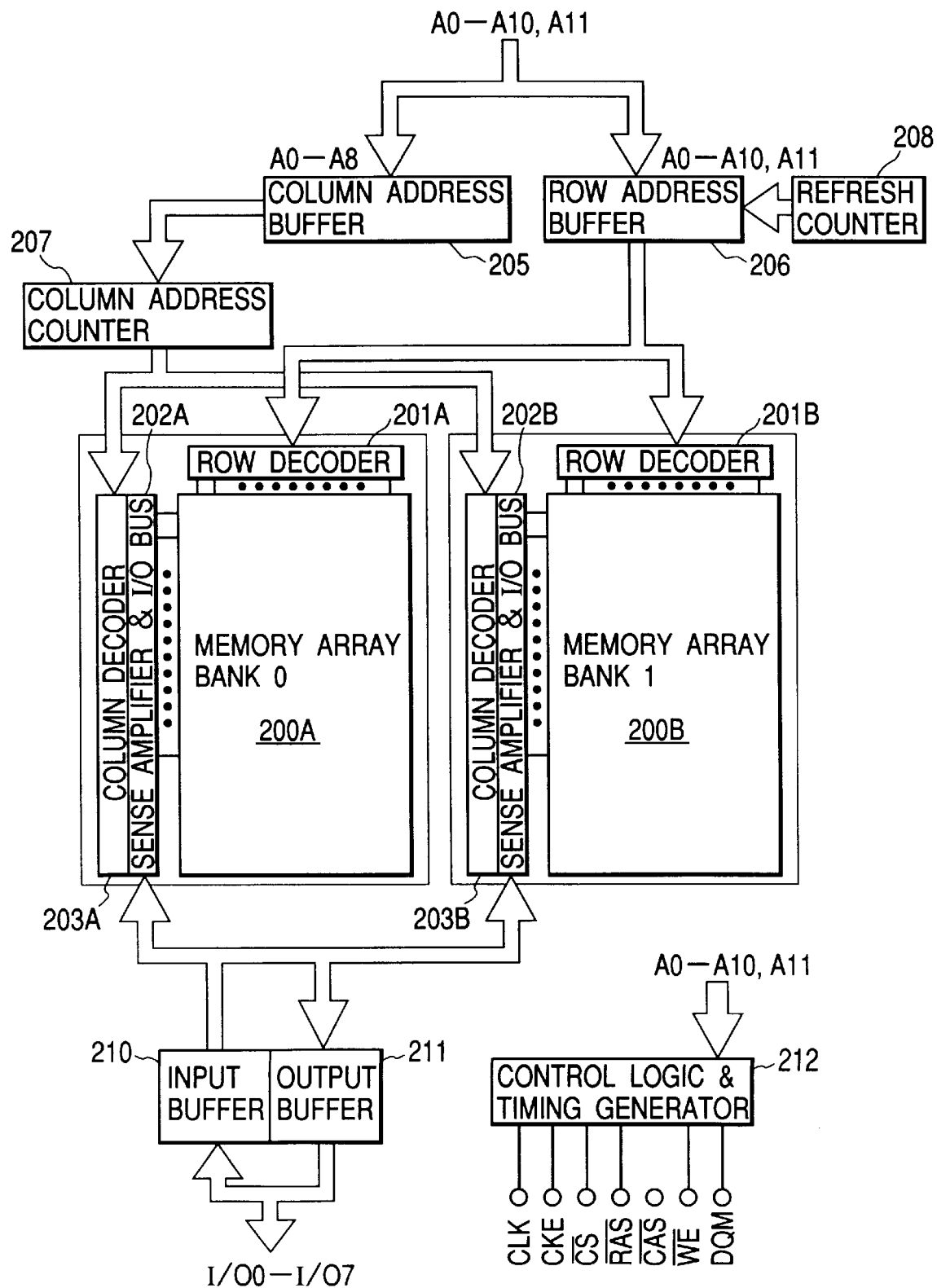
FIG. 1 is a schematic block diagram showing an embodiment of an SDRAM to which the present invention is applied.

FIG. 1 shows a schematic block diagram of an embodiment of a synchronous DRAM (hereafter referred to as an SDRAM) to which the present invention is applied. The SDRAM of FIG. 1, though the invention is not so restricted is formed on a semiconductor substrate made of, for example, single-crystal silicon by a publicly-known semiconductor integrated circuit fabrication technique.

The SDRAM of this embodiment is provided with a memory array 200A constituting a memory bank 0 (BANK 0) and a memory array 200B constituting a memory bank 1 (BANK 1). The memory arrays 200A and 200B are respectively provided with dynamic memory cells arranged in a matrix array. According to FIG. 1, selection terminals of the memory cells arranged in the same column are connected to a word line (not illustrated) for each column and data input/output terminals of memory cells arranged in the same row are connected to complimentary data lines (not illustrated) for each row.

One of the not-illustrated word lines of the memory array 200A is driven to a selection level in accordance with the decoding result of a row address signal by a row (X) decoder 201A. The not-illustrated complimentary data lines of the memory array 200A are connected to a sense amplifier & I/O bus 202A. The sense amplifier of the sense amplifier & I/O bus 202A is an amplifier for detecting and amplifying a very small potential difference appearing on each complimentary data line by reading data from the memory cells. A column (Y) switching circuit of the amplifier is a switching circuit for selecting each complimentary data line and electrically connecting the line with a complimentary common data line (I/O bus). The column switching circuit is selectively operated in accordance with the decoding result of a column address signal by a column decoder 203A.

A row decoder 201B, sense amplifier & I/O bus 202B, and column decoder 203B are also provided on the memory array 200B side similar to the above case. The complementary common data line (I/O bus) of the memory banks 200A and 200B is connected to the output terminal of an input buffer 210 and the input terminal of an output buffer 211. The input terminal of the input buffer 210 and the output terminal of the output buffer 211 are connected to 8-bit data input/output terminals I/O0 to I/O7.

Row (X) address signals and column (Y) address signals supplied from address input terminals A0 to A11 are captured by a column (Y) address buffer 205 and a row (X) address buffer 206 in the form of an address multiplexing format. The supplied row and column address signals are held by the corresponding buffers 205 and 206. The row address buffer 206 captures a refresh address signal output from a refresh counter 208 as a row address signal in the refreshing operation mode. The output of the column address buffer 205 is supplied to a column address counter 207 as its preset data, and the column address counter 207 outputs a column address signal as the preset data or a value obtained by successively incrementing the column address signal to the column decoders 203A and 203B in accordance with the operation mode designated by a command to be mentioned later.

A control logic & timing generator 212, though the invention is not so restricted, receives such external control signals as a clock signal CLK, clock enable signal CKE, chip select signal /CS, column strobe signal /CAS (symbol / means that a signal having a name to which the symbol / is added is a row enable signal), row address strobe signal /RAS, write enable signal /WE, and data input/output mask control signal DQM, and control data supplied from the address input terminals A0 to A11 to generate internal timing signals for controlling the operation mode of an SDRAM and the operation of the circuit block in accordance with the changes or timings of the levels of those signals. Therefore, the generator 212 is provided with control logic and a mode register for generating the internal timing signals.

The clock signal CLK is used as a master clock of an SDRAM and other input signals are made significant when synchronized with the leading edge of the internal clock signal. The chip select signal /CS orders the start of a command input cycle at its low level. The chip select signal /CS at its high-level (chip non-selection state) and other inputs do not have any effect. However, the memory-bank selection state and internal operations, such as a burst operation to be described later, are not influenced by the change to the chip non-selection state. The functions of the signals /RAS, /CAS, and /WE are different from those of corresponding signals of a normal DRAM and the signals are used as significant signals when defining a command cycle to be described later.

The clock enable signal is a signal for designating the effectiveness of the next clock signal. The leading edge of the next clock signal is made effective when the signal CKE is at a high-level, high-level but it is made ineffective when the signal CKE is at a low-level. Moreover, though not illustrated, an external control signal for controlling the output enable condition for the output buffer 211 in the read mode is also supplied to the control logic & timing generator 212 and when the signal is at high-level, the output buffer 211 is brought to a high-output impedance state.

The row address signal is defined by the level of A0 to A10 in a row-address-strobe bank active command cycle synchronized with the leading edge of the clock signal CLK (internal clock signal). The input from A11 is regarded as a bank select signal in the row-address-strobe bank active command cycle. That is, a memory bank A is selected when the input of A11 is at low-level and a memory bank B is selected when the input of A11 is at high-level. Memory bank selection control, though the invention is not so restricted, can be performed by activation of only the row decoder of the selected memory bank side, non-selection of all column switching circuits of the non-selected memory bank side, or connection of only the selected memory bank side to the input buffer 210 and output buffer 211.

The input of A10 in a precharge command cycle to be described later specifies a precharging operation mode for an complimentary data line, the high-level input specifies that both banks are the object to be precharged, and the low-level input specifies that one memory bank specified by A11 is an object to be precharged.

The column address signal is defined by the level of A0 to A8 in a read or write command (column address read command or column address write command to be described later) cycle synchronized with the leading edge of the clock signal CLK (internal clock). Moreover, the column address thus defined is used as the start address for burst access.

Then, main operation modes of an SDRAM ordered by the commands will be described below.

(1) Mode register set command (Mo)

This is a command for setting the mode register 30, which is command-designated by /CS, /RAS, /CAS, or /WE=low level and data to be set (register set data) is supplied through A0 to A11. The register set data, though the invention is not so restricted, includes the burst length, CAS latency, and write mode. Though the invention is not so restricted, the burst length which can be set is 1, 2, 4, 8, or a full page, the CAS latency which can be set is 1, 2, or 3, and the write mode which can be set is the burst write and single write operation.

The CAS latency specifies the number of internal-clock-signal cycles to be consumed from the fall of /CAS to the output operation of the output buffer 211 in the reading operation ordered by the column address read command to be described later. An internal operation time for reading data is required before read data is determined. The CAS latency is used to determine the internal operation time in accordance with the frequency of the internal clock signal. In other words, the CAS latency is set at a relatively large value when using a high-frequency internal clock signal, but it is set at a relatively small value when using a low-frequency internal clock signal.

(2) Row-address-strobe bank active command (Ac)

This is a command for specifying a row-address-strobe and making memory bank selection effective, and is designated by /CS, /RAS=low level, /CAS, or /WE=high level. In this case, an address supplied to A0 to A10 is captured as a row address signal, and a signal supplied to A11 is captured as a memory-bank select signal. The capturing operation is performed synchronously with the leading edge of an internal clock signal as described above. For example, when this command is specified, a word line in the memory bank designated by the command is selected, and memory cells connected to the word line are electrically connected to their corresponding complimentary data lines.

(3) Column address read command (Re)

This is a command required to start the burst reading operation and, also, is a command for giving the instruction of column address strobe, which is designated by /CS, /CAS=low level, /RAS, or /WE=high level. In this case, the column address supplied to A0 to A8 is captured as a column address signal. The column address signal thus captured is supplied to the column address counter 207 as the burst start address. Before the burst reading operation ordered by the command, a memory bank and a word line in the memory bank are selected in the row-address-strobe bank active command cycle, and the memory cells of the selected word line are successively selected and continuously read in accordance with address signals output from the column address counter 207 synchronously with internal clock signals. The number of data continuously read is equal to the number of data specified by the burst length. Moreover, the reading of data from the output buffer 211 is started after the internal-clock-signal cycles, the number of which is specified by the CAS latency.

(4) Column address write command (Wr)

This is a command required to start the burst writing operation when burst write is set to a mode register as a writing operation mode, and a command required to start the single writing operation when single write is set to the mode register as a writing operation mode. Moreover, this command gives the instruction of column address strobe for a single write and burst write operation. This command is specified by /CS, /CAS, /WE=low level, or /RAS=high level, and, in this case, the address to be supplied to A0 to A8 is captured as a column address signal. The column address signal thus captured is supplied to the column address counter 207 as the burst write address in the case of a burst write operation. The burst writing operation ordered by this command is also performed in accordance with the procedure of the burst reading operation. However, there is no CAS latency for the writing operation, and the capture of write data is started from the column address write command cycle.

(5) Precharge command (Pr)

This is a command for starting the precharging operation for memory banks selected by A10 and A11, and specified by /CS, /RAS, /WE=low level, or /CAS=high level.

(6) Autorefresh command

This is a command required to start autorefresh, which is specified by /CS, /RAS, /CAS=low level, /WE, or CKE=high level.

(7) Burst-stop-in-full-page command

This is a command for stopping all memory banks performing the burst operation for a full page, and is ignored in the burst operations other than the burst operation for a full page. This command is specified by /CS, /WE=low level, /RAS, or /CAS=high level.

(8) No-operation command (Nop)

This is a command for specifying that no practical operation is performed, and is specified by /CS-low level, /RAS, /CAS, or /WE=high level.

In the case of an SDRAM, while the burst operation is performed in one memory bank, even when the other memory bank is specified and a row-address-strobe bank active command is supplied, the operation of a row address system in the other memory bank can be performed without influencing the operation of the one memory bank under execution. For example, the SDRAM has means for storing data, an address and a control signal supplied from an external unit, and particularly the address and control signal, though the invention is not so restricted, are stored in every memory bank. Alternatively, the data for one word line in a memory block selected in the row-address-strobe bank active command cycle is previously latched for the reading operation by a not-illustrated latch circuit before a column-system operation.

Therefore, as long as data does not collide with each other at the data input/output terminals I/O0 to I/O7, it is possible to previously start the internal operation by issuing, while a command is being executed and not finished, a precharge command or row-address-strobe bank active command to a memory bank different from the memory bank which is the object of the command being executed.

An SDRAM can be defined as a memory capable of inputting or outputting data, addresses, or various control signals including /RAS and /CAS synchronously with the internal clock signal generated in accordance with an external clock signal CLK. The SDRAM is able to operate a large-capacity memory equal to a DRAM at a high speed equal to that of an SRAM (static RAM) and, moreover, is able to continuously read or write a plurality of data by specifying the number of data to be accessed for one selected word line by a burst length, thereby, successively switching the column-system selection state using the built-in column address counter 207.

Figure 2:
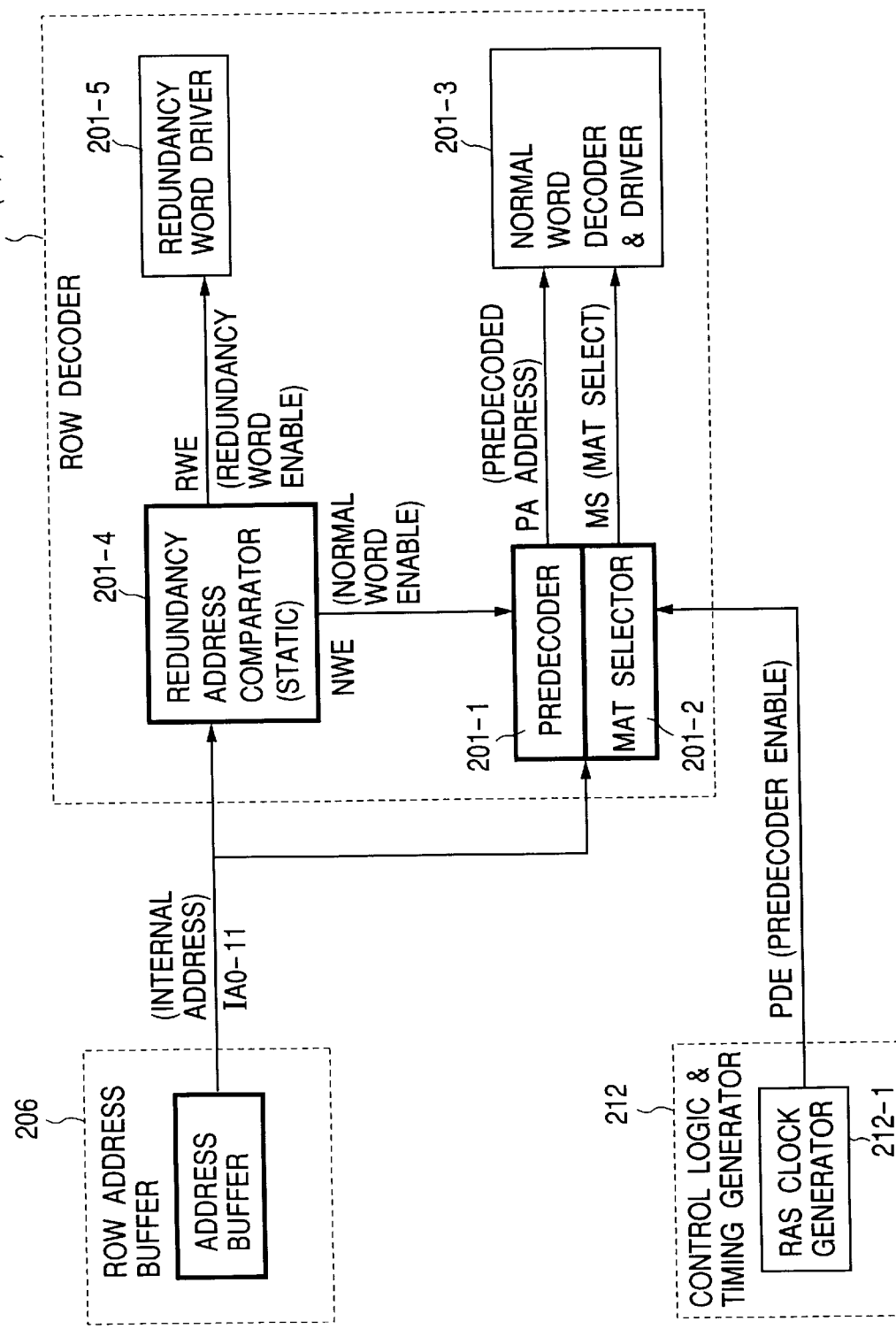
FIG. 2 is a block diagram of an essential portion, illustrating an embodiment of a redundant system of the present invention.

FIG. 2 shows a block diagram of an essential portion, illustrating an embodiment of a redundant system of the present invention. In FIG. 2, the row address buffer 206 of FIG. 1 and a part of the row decoder 201 and control logic & timing generator 212 are illustrated. The row decoder shown is the circuit corresponding to only one bank.

The row decoder 201 of this embodiment comprises a predecoder 201-1, a mat selector 201-2, a normal word decoder & driver 201-3, a redundancy address comparator 201-4 for relieving a defect, and a redundancy word driver 201-5.

Among the circuit blocks, the predecoder 201-1, mat selector 201-2, and redundancy address comparator 201-4 are circuits activated even when an SDRAM is waiting (in a standby state), in addition to the address buffer 206 shown by a thick line. Therefore, the redundancy address comparator 201-4 comprises a static circuit and requires no start signal for its address comparing operation.

In this embodiment, redundant address comparison is performed by using the setup time of an address signal. When a bank start signal is input, the embodiment generates a predecode start signal PDE generated by a RAS clock generator 212-1 included in the control logic & timing generator 212, controls the predecoder 201-1 and mat selector 201-2, and outputs a decode signal corresponding to the input internal address signal. Because the redundancy address comparator generates a decision result NWE (Normal Word Enable) or RWE (Redundancy Word Enable) between the input address signal and the stored defective address, the operation of the next-stage circuit is selected without the time for the above comparison and decision.

The X-system operation of an SDRAM is determined by the speed at which a mat select signal is output and depends on the speed for redundancy decision. The redundancy address comparator 201-4 of this embodiment captures an address signal by activating the address buffer. In the case of a structure constituted of a static circuit, the start signal is unnecessary. A structure for performing substantial comparison and decision of defective addresses by using the setup time of the address signal is advantageous to the acceleration of the X-system operation.

Figure 3:
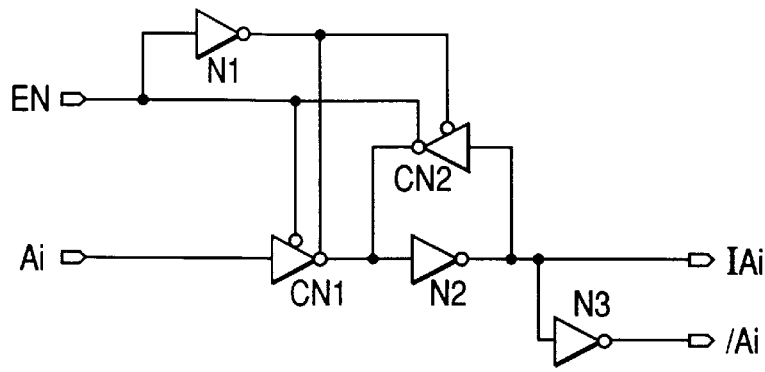
FIG. 3 is a circuit diagram showing an embodiment of the address buffer of FIG. 2.

FIG. 3 shows a circuit diagram of an embodiment of the address buffer. This embodiment uses a through-latch circuit. That is, an address signal Ai is supplied to the input terminal of a clocked inverter circuit CN1. The output signal of the clocked inverter circuit CN1 is supplied to the input terminal of an inverter circuit N2. The output signal of the inverter circuit N2 is output as a non-inverted internal signal IAi. The output signal of the inverter circuit N2 is supplied to the input terminal of an inverter circuit N3. The output signal of the inverter circuit N3 is output as an inverted internal signal /IAi. The output signal of the inverter circuit N2 is also supplied to the input of the clocked inverter circuit CN2. The output terminal of the clocked inverter circuit CN2 is connected to the output terminal of the clocked inverter circuit CN1 and the input terminal of the inverter circuit N2.

To cause the clocked inverter circuits CN1 and CN2 to perform a through operation and a latching operation by complimentarily activating the circuits CN1 and CN2, an operation control signal EN and an inverted signal generated by the inverter circuit N1 are complimentarily supplied to the clocked inverter circuits CN1 and CN2. That is, when the operation control signal EN is at low-level, the clocked inverter circuit CN1 is activated to capture an address signal Ai. In this case, the clocked inverter circuit CN2 is brought to an inactive state and is made to have an output high impedance. When the operation control signal EN is changed to high level, the clocked inverter circuit CN2 is activated at the change timing, and the address signal Ai input immediately before the circuit CN2 is activated is latched. That is, the clocked inverter circuit CN2 is activated by the high-level operation control signal EN to hold the captured address signal together with the inverter circuit N2.

The operation control signal is generated in correspondence to the bank start signal to latch an input signal so that internal address signals Ali and /Ali are not changed in correspondence to the change of subsequent input address signals. By stopping the change of these internal address signals, it is possible to control wasteful current consumption. When wasteful current consumption can be ignored, it is possible to replace the address buffer with a mere inverter circuit.

Figure 4:
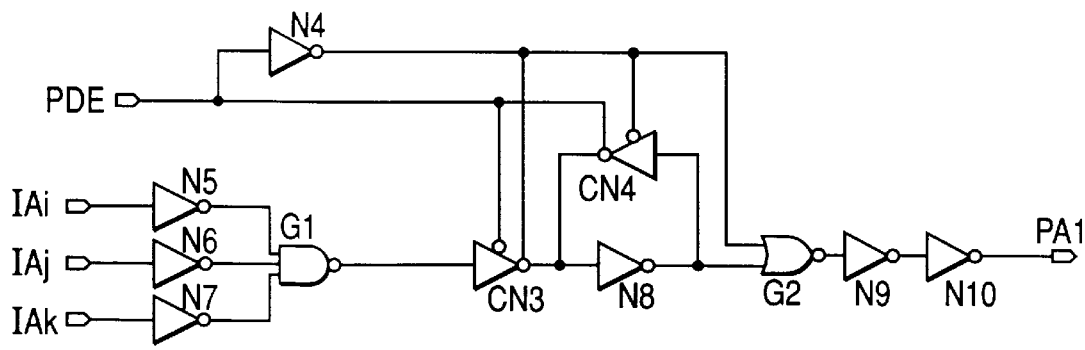
FIG. 4 is a circuit diagram showing an embodiment of the predecoder of FIG. 2.

FIG. 4 shows the circuit diagram of an embodiment of the predecoder. The predecoder of this embodiment decodes low-order address signals IAi to IAk and is activated even if a normal-system circuit or a redundancy-system circuit is selected and performs the decoding operation by inverter circuits N5 to N7 and a NAND gate circuit G1, which receives the output signals of the circuits N5 to N7. Because the address buffer is always activated as described above, a through latch circuit is provided to the output section. That is, a through latch circuit similar to the above one is constituted of the clocked inverter circuits CN3 and CN4, inverter circuit N8, and inverter circuit N4 for generating a predecoder start signal PDE and its inverted signal.

A gate circuit G2 is provided to the output section of the through latch circuit so as to prevent the address buffer from being activated even in the standby state and a word line from being selected in response to an invalid address signal. The gate circuit G2 comprises a NOR gate circuit, and an output signal of the inverter circuit N4 is supplied to the circuit G2 as its control signal. Thereby, while the through latch circuit performs a through operation in accordance with the low-level predecoder start signal PDE, the output signal of the gate circuit G2 is fixed to a low level, and the address selecting operation is stopped. That is, a predecode signal corresponding to an effective address signal is latch at the timing when the predecoder start signal PDE changes from low to high level and the gate circuit G2 opens its gate to output a predecode signal PA1. The predecode signal PA1 is output through a driver comprising the inverter circuits N9 and N10.

Figure 5:
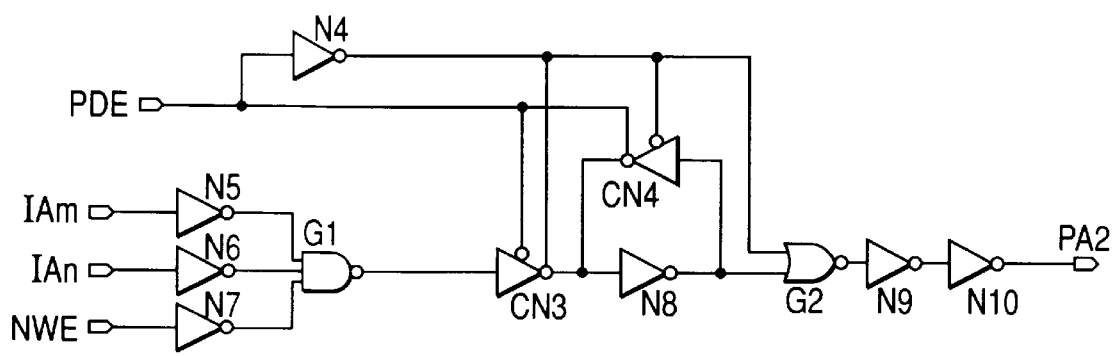
FIG. 5 is a circuit diagram showing an embodiment of the predecoder of FIG. 2.

FIG. 5 shows the circuit diagram of an embodiment of the predecoder. The predecoder of this embodiment decodes middle-rank address signals IAm and IAn and it is activated only when selecting a normal-system circuit. That is, not only the address signals IAm and IAn, but also a decision signal NWE for ordering the storage of a defective address and the selection of a normal circuit, sent from the reduncy address comparator, are input to the predecoder as input signals. The predecoder is substantially the same as the predecoder of FIG. 4 except for the above fact. That is, the predecoder of this embodiment performs the decoding operation using the inverter circuits N5 to N7 and the NAND gate circuit G1 which receives the output signals of the circuits N5 to N7 similar to the above mentioned one, and a through latch circuit and a gate circuit are connected to the output side of the predecoder.

Figure 6:
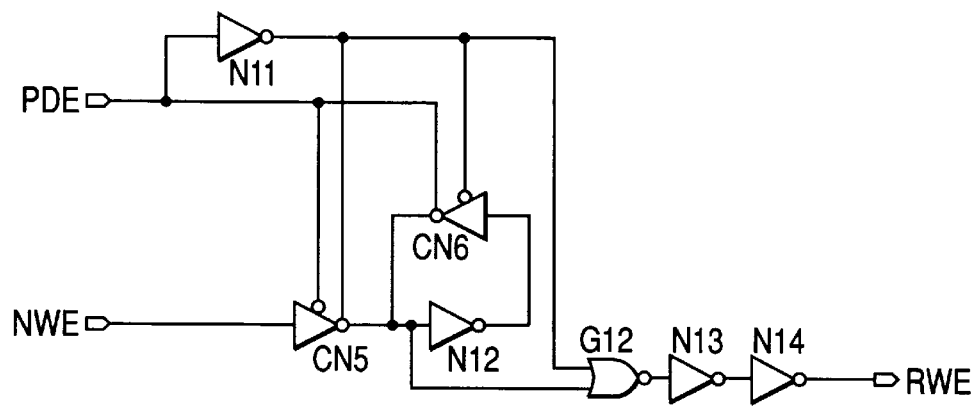
FIG. 6 is a circuit diagram showing an embodiment of the redundancy word driver of FIG. 2.

FIG. 6 shows the circuit diagram of an embodiment of the redundancy word driver. The decision signal NWE sent from the redundancy address comparator is input to a through latch circuit comprising the clocked inverter circuit N6, inverter circuit N12, clocked inverter circuit CN6, and inverter circuit N11 for receiving the predecode start signal PDE, and the decision signal NWE when the start signal PDE is generated is captured. The output signal of the through latch circuit is output through the gate circuit G12 and inverter circuits N13 and N14 constituting a driving circuit and a driver. To prevent a defective-address comparison result from being output even in the standby state, the output signal of the gate circuit G12 is fixed to a low level to stop the redundant word line selecting operation while the through latch circuit performs the through operation in accordance with the low-level predecoder start signal PDE similar to the above mentioned one.

Figure 7:
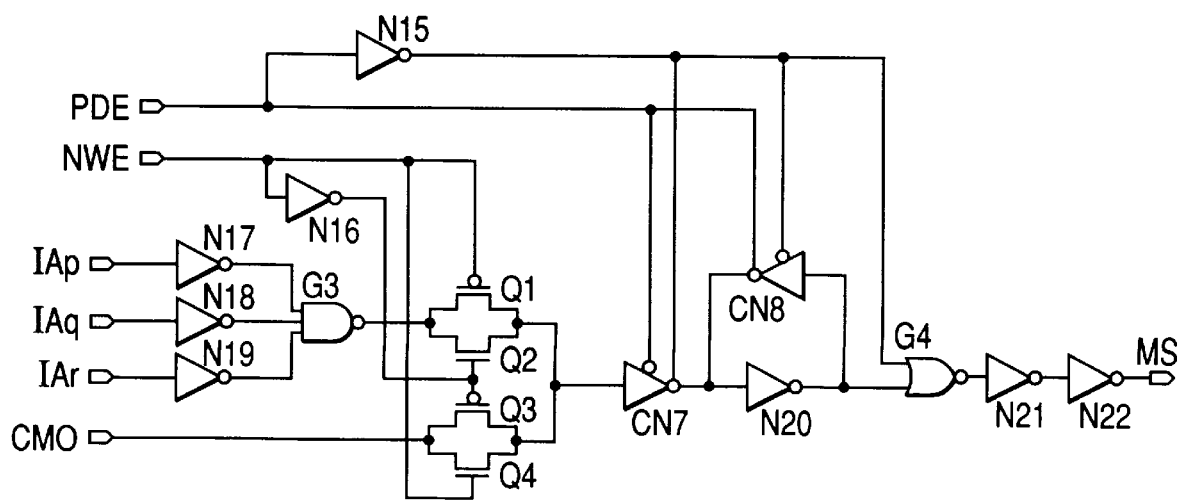
FIG. 7 is a circuit diagram showing the mat selector of FIG. 2.

FIG. 7 shows the circuit diagram of an embodiment of the mat selector. Inverter circuits N17 to N19 and a gate circuit G3 decode a three-bit address signal to select one memory mat out of eight memory mats. A mat select signal generated by the gate circuit G3 and a mat select signal CM0 corresponding to the redundancy word line assigned to the redundancy address comparator are output as mat select signals through a multiplexer comprising MOSFETs Q1 to Q4.

The mat selector also activates the address buffer even in the standby state, as described above. To prevent a mat select signal from being generated in response to such an invalid address signal, a through latch circuit comprising clocked inverter circuits CN7 and CN8, inverter circuit N20, and inverter circuit N15 for receiving the predecode start signal PDE, a gate circuit G4, and inverter circuits N21 and N22 serving as driving circuits and drivers are used similarly to the above mentioned.

The gate circuit G4 comprises a NOR gate circuit, and the output signal of the inverter circuit N4 for receiving the predecoder start signal PDE is supplied to the circuit G4 as its control signal. Thereby, the output signal of the gate circuit G2 is fixed to a low level, and the outputting of a mat select signal is stopped while the through latch circuit performs a through operation in accordance with the low-level predecoder start signal PDE. The decision signal NWE is supplied to the multiplexer comprising MOSFETs Q1 to Q4. That is, when the signal NWE is at the low-level, a P-channel MOSFET Q1 is turned on, and an N-channel MOSFET Q2 is turned on in accordance with the high-level inverted state of the signal NWE. Therefore, the mat select signal generated by the gate circuit G3 is made effective and is output. However, when the signal NWE is at the high-level, an N-channel MOSFET Q4 is turned on, and a P-channel MOSFET Q3 is turned on in accordance with the low-level inverted signal of the signal NWE. Therefore, the output signal CMO of the redundancy address comparator is output. By using the multiplexer, it is possible to replace the defective word line in the other memory mat with a redundant word line provided for the memory mat selected by the circuit. Thereby, it is possible to determine the object of the defective-address relief not through the memory mat and improve the relief efficiency.

Figure 8:
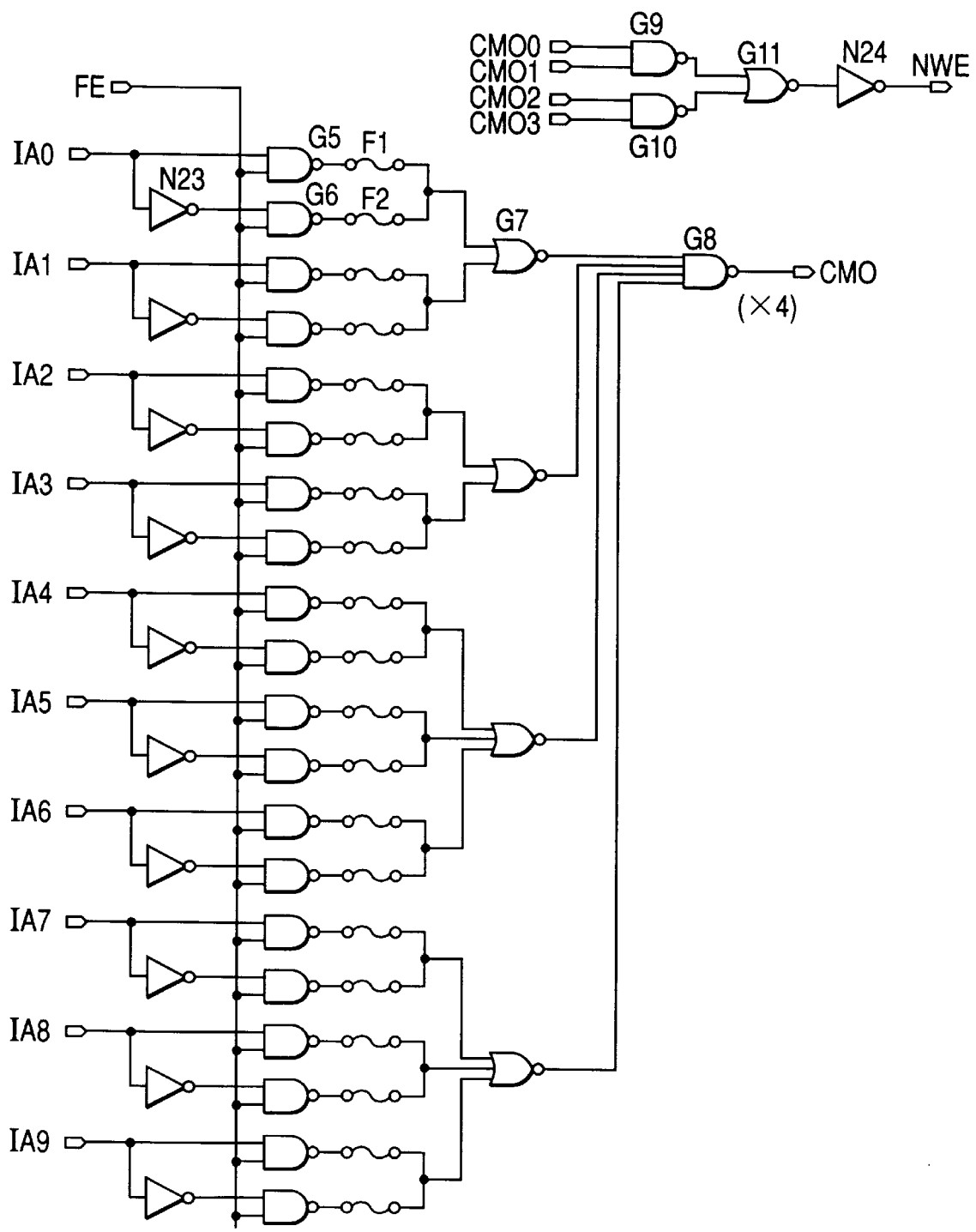
FIG. 8 is a circuit diagram showing an embodiment of a redundancy address comparator of FIG. 2.

FIG. 8 shows the circuit diagram of an embodiment of the redundancy address comparator. As described above, an address buffer generates a non-inverted address signal IAi and an inverted address signal /IAi, and the internal address signal IAi which is one of the signals IAi and /IAi is supplied to the redundancy address comparator. Thereby, it is possible to decrease the number of wiring lines between the address buffer 206 and the redundancy address comparator.

In the case of this embodiment, non-inverted address signals IA0 to IA9, each comprising 10 bits out of the internal address signals generated by the address buffer 206, are transmitted, and non-inverted address signals are generated by the inverter circuit N23 and the like. The non-inverted address signal IA0 transmitted from the address buffer 206 and the inverted address signal (/IA0) generated by the inverter circuit N23 are supplied to one of the input terminals of each of NAND gate circuits G5 and G6. A fuse enable signal FE is supplied to the other input terminal of each of the NAND gate circuits G5 and G6. Also, for the other internal address signals IA1 to IA9, an inverter circuit and a NAND gate circuit similar to the above ones are used.

Fuses F1 and F2 are provided to the transmission paths of the output terminals of the NAND gate circuits G5 and G6, respectively. Other ends of the fuses F1 and F2 are connected in common and supplied to one input of an OR gate G7. The signal output from a NAND gate circuit corresponding to the address signal IA1 is transmitted to the other input of the OR gate circuit G7. Similarly, address signals of adjacent two bits are paired for every two bits and input to a NOR gate circuit similar to the above one. When an address signal comprises ten bits like the above address signals IA0 to IA9, a total of five NOR gate circuits is used for every two bits, and these NOR gate circuits and a NAND gate circuit G8 for receiving the output signals of the NOR gate circuits constitute a comparator.

One of the fuses F1 and F2 is blown corresponding to a defective address. These fuses F1 and F2, though the invention is not so restricted, are formed of the uppermost aluminum layer and one of them is blown by irradiation with a laser beam. As described above, when a comparator comprises a combination of a NOR gate circuit and a NAND gate circuit, and when a defective address coincides with the input address, a low level signal is transmitted to the NOR gate through a fuse. For example, when the fuse F2 is blown, a low level signal of the NAND gate circuit G5 is output as a match signal when the internal address signal IA0 is at the high-level. The output signal of the NAND gate signal G5 changes to a high-level and the output of the NOR gate circuit G7 changes to a low-level when the internal address signal IA0 is at the low level.

When storing no defective address in the fuses F1 and F2, in other words, when both fuses of each of the above ten pairs of fuses are not blown, the fuse enable signal FE is not generated. That is, the signal FE is brought at a low level. Therefore, the output signals of the NAND gate circuits G5 and G6 paired independently of the internal address signals IA0 to IA9 are changed to a high level and a mismatch signal is output before a current flows between the output terminals of the circuits G5 and G6.

When a low-level match signal is output from each bit of the internal address signals IA0 to IA9, the inputs of the NOR gate circuit G7 and the like are all set at low level, and the output signal is set at a high level. As a result, a low-level match signal CMO is generated by the NAND gate circuit G8. In the case of this embodiment, four sets of such redundancy address comparators are used. The above four comparison outputs CMO0 to CMO3 are input to NAND gate circuits G9 and G10 in units of two bits, and the output signals of the circuits G9 and G10 are input to a NOR gate circuit G11 and then output through an output inverter circuit N24. Thereby, in four redundancy address comparators, a normal-system word line start signal NWE is generated which is set at a low level only when all the output signals CMO0 to CMO3 are high-level mismatch outputs.

In the four redundancy address comparators, when any one (e.g. CMO0) of the output signals CMO0 to CMO3 is output as a low-level match signal, the normal-system word line start signal NWE is set at a high level, the normal-system circuit selecting operation is stopped, a redundant word line select signal RWE is generated by the redundancy word driver shown in FIG. 6 instead, and a mat select signal MS when a redundant word line is formed by the mat selector shown in FIG. 7 is generated corresponding to the match signal CMO0.

Figure 9:
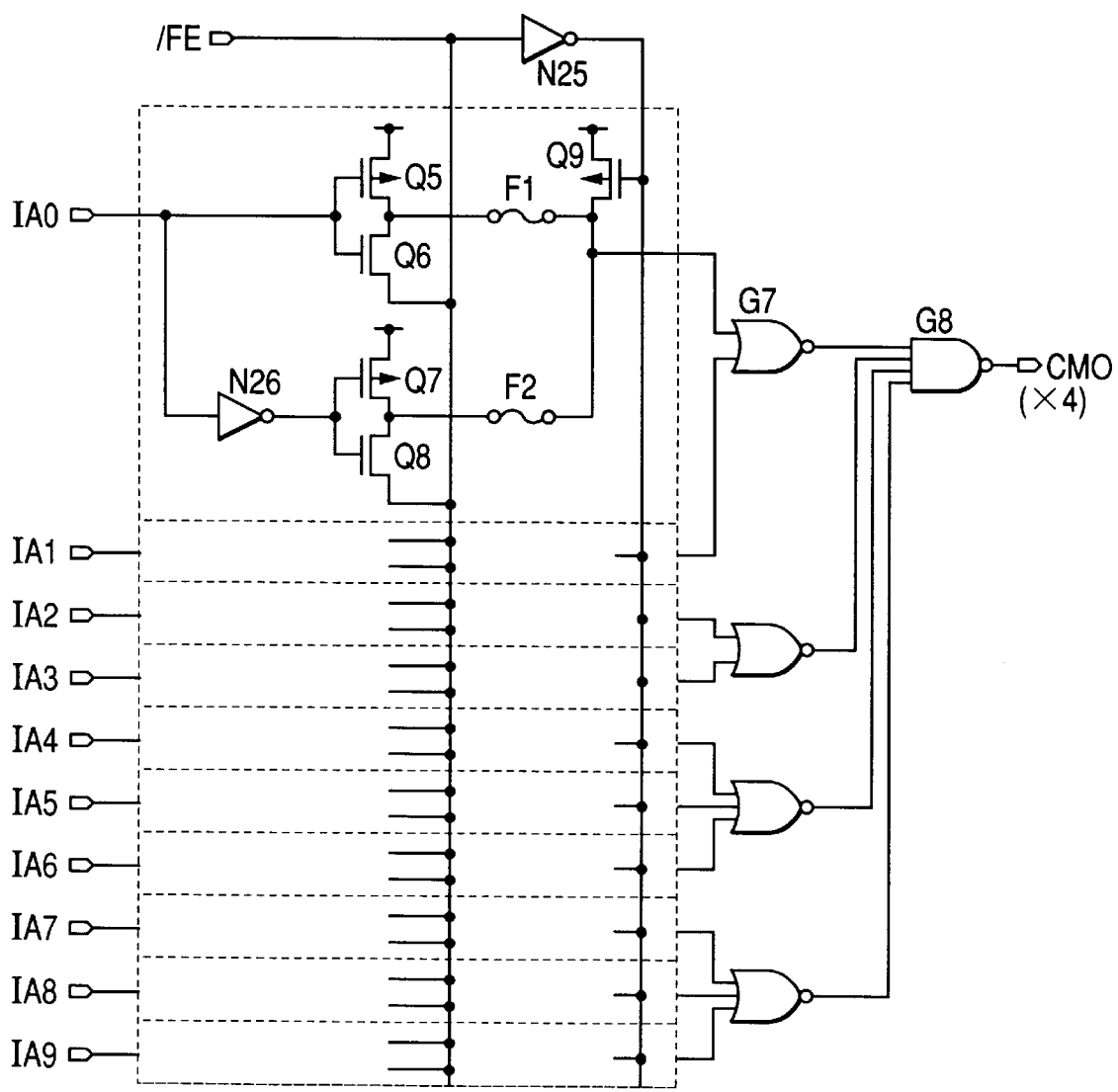
FIG. 9 is a circuit diagram showing another embodiment of the redundancy address comparator of FIG. 2.

FIG. 9 shows the circuit diagram of another embodiment of the redundancy address comparator. In this embodiment, the NAND gate circuits G5 and G6 of FIG. 8 are replaced with inverter circuits in order to simplify the circuit structure. That is, an inverter circuit corresponding to the NAND gate circuit G5 is constituted of a P-channel MOSFET Q5 and an N-channel MOSFET Q6 and an inverted fuse enable signal /FE is supplied to the source of the N-channel MOSFET Q6 in order to add a gate function. Also, in an inverter circuit comprising a P-channel MOSFET Q7 and an N-channel MOSFET Q8 corresponding to the NAND gate circuit G6, the signal /FE is similarly supplied to the source of the N-channel MOSFET. Moreover, a pull-up P-channel MOSFET Q9 is provided on the output side of the fuses F1 and F2 connected in common, and the output signal of an inverter circuit N25 for receiving the fuse enable signal /FE is supplied to the gate of the MOSFET Q9.

When the fuse enable signal /FE is at a high-level, a gate function similar to that of the NAND gate circuit is added by setting the grounding-side potential of an inverter circuit for transmitting non-inverted and inverted internal address signals to the fuses F1 and F2 at a high level corresponding to the power supply voltage by the signal /FE. When the fuse enable signal /FE is at a low-level, normal operation is performed by supplying the grounding-side potential of the inverter circuit for transmitting non-inverted and inverted internal address signals to the fuses F1 and F2.

It is also possible to omit the inverter circuit N25 and the pull-up MOSFET Q9. When the fuse enable signal /FE is at a high-level and when the internal address signal IA0 is at a high-level, the output signal of the inverter circuit N26 changes to low-level to turn on the P-channel MOSFET Q7 and transmit a high level corresponding to the power supply voltage to one input of the NOR gate circuit G7 through the fuse F2. When the fuse enable signal /FE is at a high-level and when the internal address signal IA0 is at a low-level, the P-channel MOSFET Q5 is turned on to transmit the high level corresponding to the power supply voltage to one input of the NOR gate circuit G7 through the fuse F1. Because the storage and comparison operation of a defective address is the same as the operation of the circuit of FIG. 8, its description will be omitted.

Figure 10:
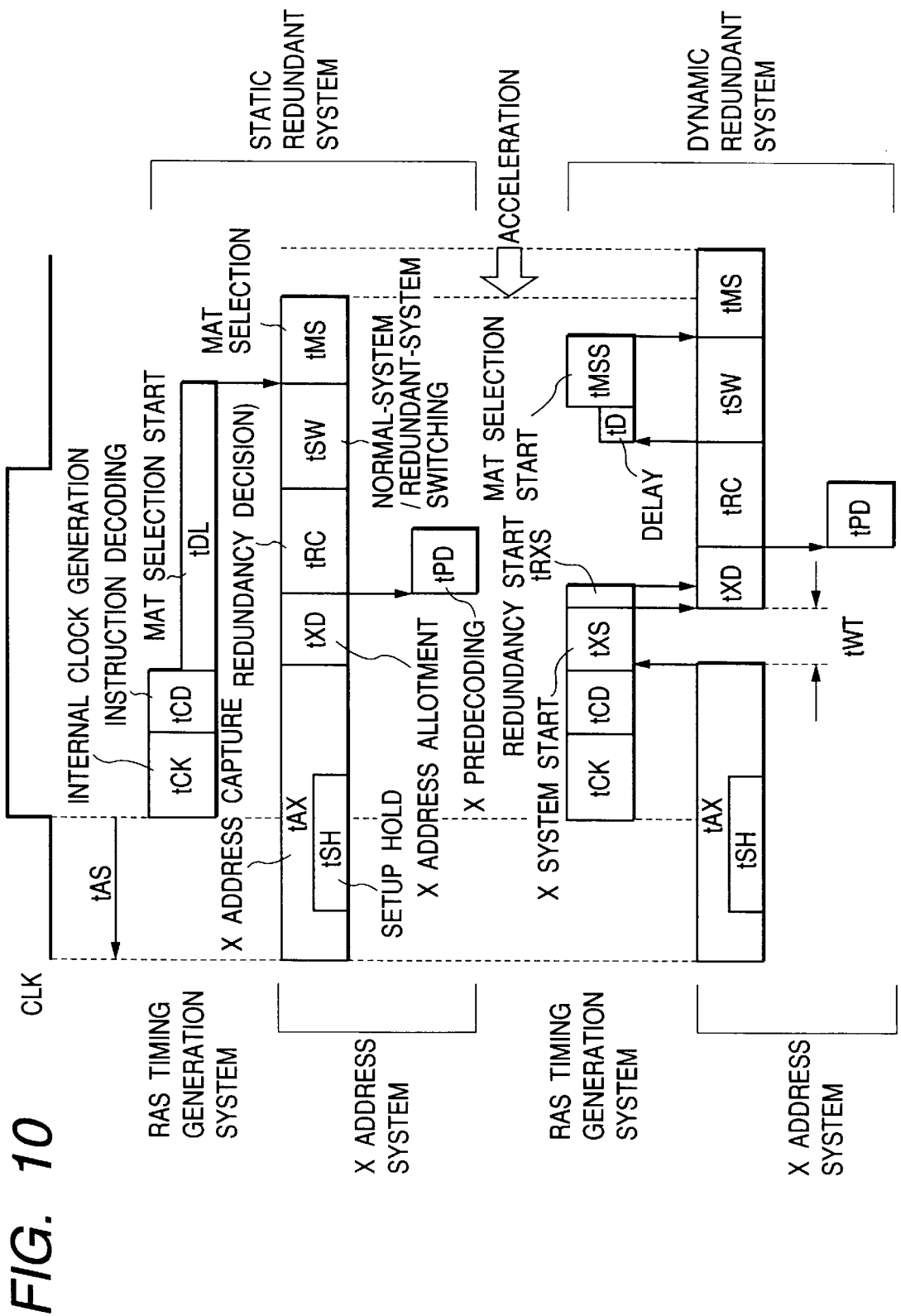
FIG. 10. is a functional diagram illustrating the redundant system of an embodiment of a dynamic RAM of the present invention.

FIG. 10 is an explanatory view illustrating the redundant system of a dynamic RAM of the present invention. FIG. 10 also shows a conventional dynamic redundant system in order to illustrate a static redundant system of the present invention. In the illustration, the time between the input and output of a signal by each circuit block of an X-system selector is shown like a bar chart along the signal transmission path and the circuit blocks are shown by classifying them into a group of a RAS timing generation system and a group of an X address system.

In the RAS timing system of the above static redundant system and the conventional dynamic redundant system, the time tAS is the setup time for an address signal, and the address signal is input before the clock signal CLK is changed to a high level. The time tCK lapses until the internal clock signal is changed to a low level correspondingly to the change of the external clock signal CLX to a high level. Instruction decoding is executed in response to the change of the internal clock signal to a low level when the time tCD lapses. After the instruction decoding, the time tDL for mat selection start is set.

In the case of the X address system, the time tAX is the time taken to capture an X address signal and the time tSH of the time tAX is the delay time of setup-hold adjustment. According to the instruction decoding, a bank activation signal is generated, allotment of through-state X address signals is started, and the time tXd lapses. According to the allotment of X address signals, redundancy decision tRC is performed by the redundancy address comparator, and at the same time, a predecoding operation tPD is executed by the predecoder. According to the result of the redundancy decision, normal/redundancy switching tSW is performed, and the mat selecting operation is executed in accordance with a mat selection start signal supplied from the RAS timing system.

In the case of the dynamic redundant system, however, the time tXS is provided after the X-address capture time tAX in order to start the X system. That is, as a result of the above instruction decoding, the X-system selecting operation is determined and then, precharging of a redundancy decision node is executed by a redundant circuit during the X-system start time tXS, and thereafter the time tRXS is taken for redundancy start. During this time tRXS, the redundancy decision node is brought into a floating state. Thereafter, the time tXD is taken for address allotment, and the redundancy decision tRC and the predecoding operation tPD are executed in parallel.

For the dynamic redundant system, a redundancy start signal is always necessary, and this signal is output upon receiving a bank activation signal for specifying the X-system selecting operation. Therefore, an address signal must wait for a redundancy generation signal at the entrance of a redundancy comparator in the X-address-system operation and, thus, a latency time tWT occurs. In the case of a static redundant system of the present invention, however, the latency time tWT is unnecessary and the RAS timing system and X address system can operate independently of each other until mat selection is started after the external clock signal CLK changes. Therefore, speed-up is realized.

Figure 11:
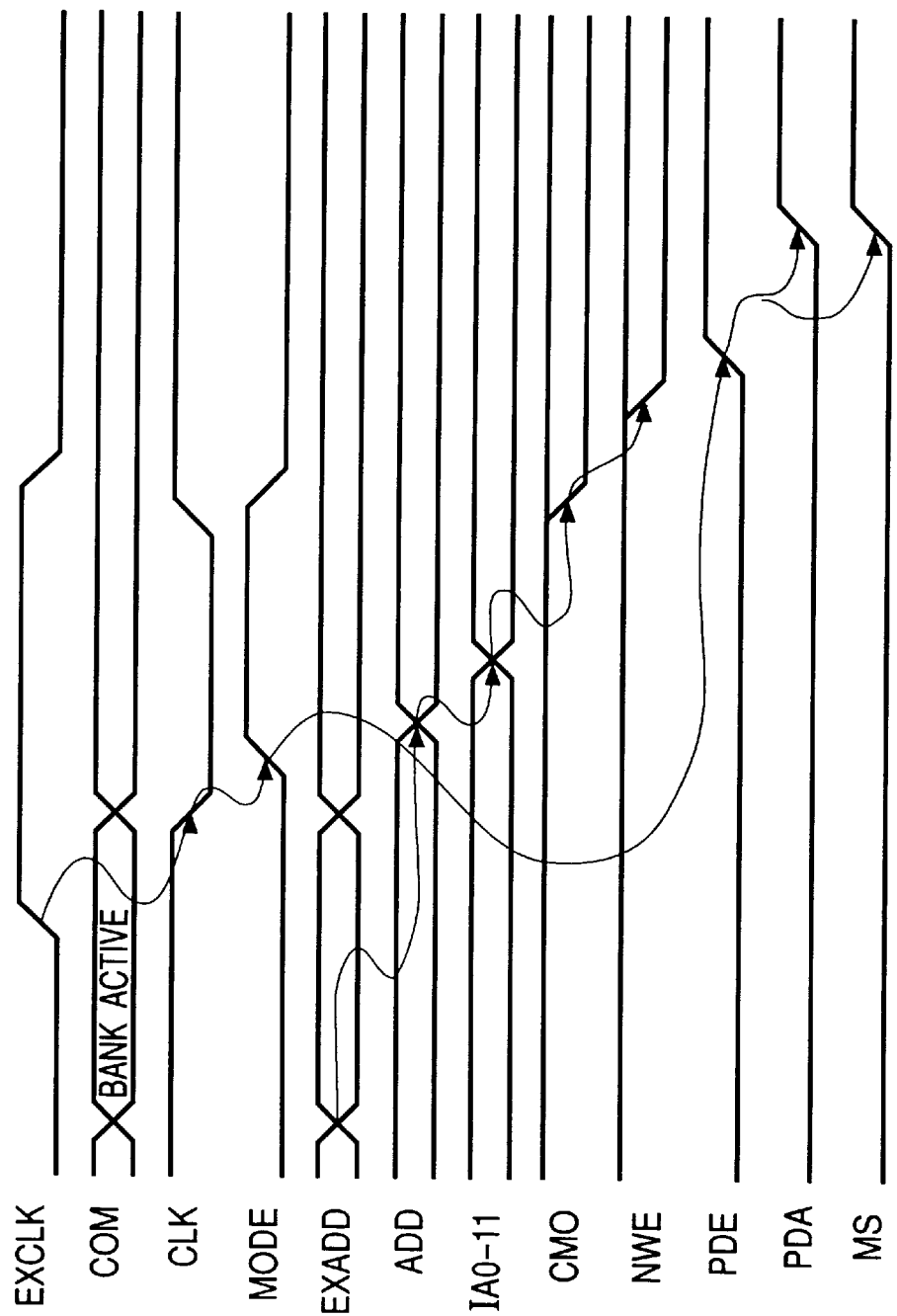
FIG. 11 is a timing chart illustrating an X-system selecting operation according to a static redundant system of the present invention.

FIG. 11 shows a timing chart for illustrating an X-system selecting operation of a static redundant system according to the present invention. The external clock signal EXCLK is changed to a high level, the internal clock signal CLK is changed to a low level corresponding to the change of the signal EXCLK, a command COM is determined, and a mode signal MODE is generated. The mode signal MODE corresponds to a bank activation signal in the case of this embodiment. By delaying the mode signal MODE, a predecoder start signal PDE is generated.

In the case of the X address system, an input signal ADD of an address buffer is generated corresponding to an external address signal EXADD, internal address signals IA0 to IA11 are generated corresponding to the signal ADD, a redundancy decision signal CMO is kept at high-level when it does not coincide with defective addresses at which the input internal address signals IA0 to IA11 are stored, but it is changed to a low level when it coincides with the defective addresses. A normal-system word line start signal NWE is generated corresponding to the high or low level. A predecoder start signal PDE is generated in conformity with the timing, normal/redundancy switching is performed, and a mat select signal MS is generated. Though not illustrated in FIG. 11, the mat select signal generates control signals for a shared switch MOSFET and a bit-line precharge and finally starts the word-line selecting operation after the control signals are generated.

Figure 12:
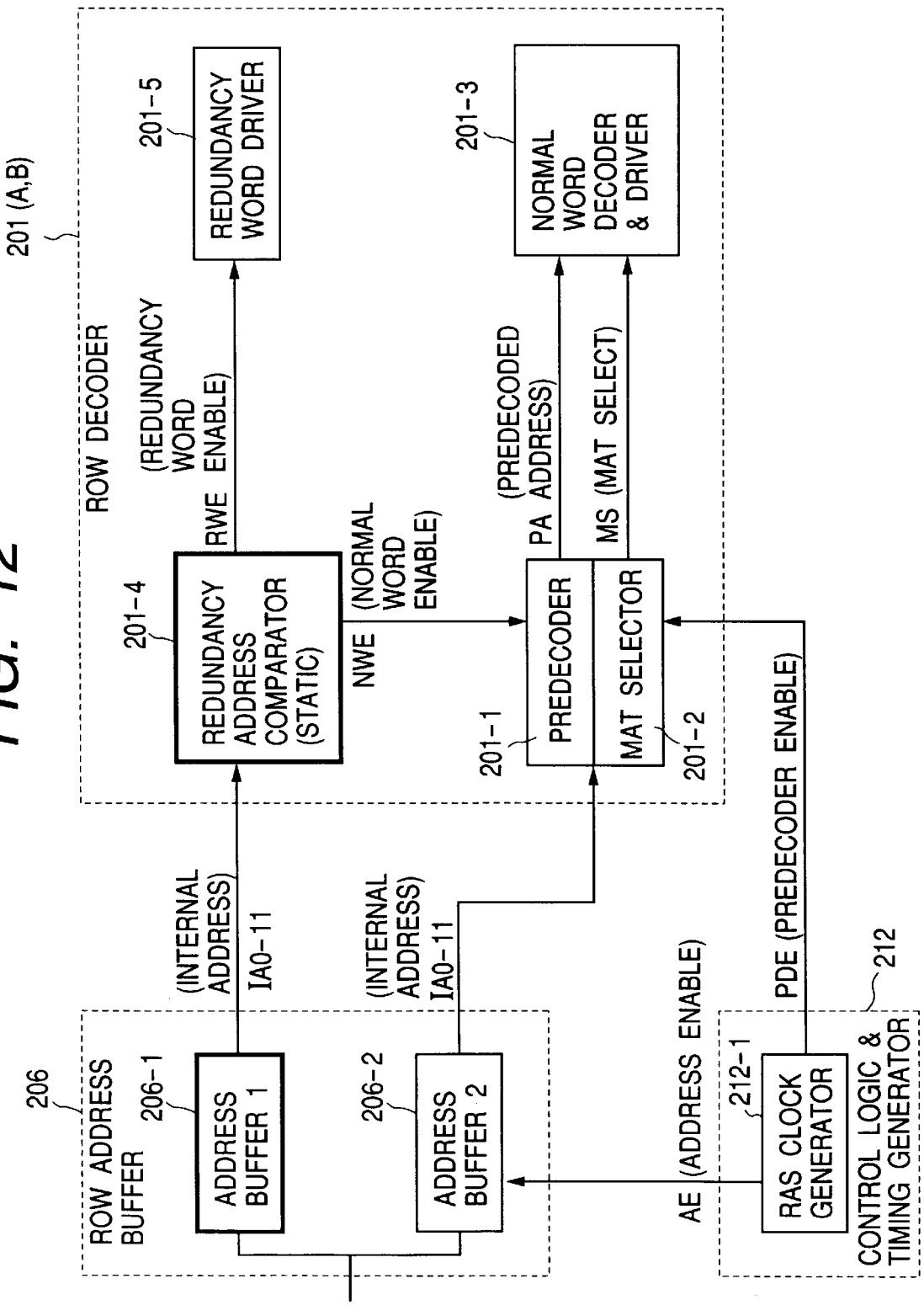
FIG. 12 is a block diagram of an essential portion, illustrating another embodiment of a redundant system of the present invention.

FIG. 12 is a block diagram of an essential portion, illustrating another embodiment of the redundant system of the present invention. In the circuit of FIG. 12, a contrivance is made so as to decrease the power consumption. In FIG. 12, a row address buffer 206, a row decoder 201, and a part of a controller 212 are illustrated and only a part of the circuit of the row decoder, corresponding to one bank are shown.

The circuit block shown by a thick line among the above circuit blocks is a circuit in which an SDRAM is activated even in the standby state similar to the embodiment in FIG. 2. This embodiment is different from the embodiment of FIG. 2 in that the address buffer 206 is divided into two address buffers 206-1 and 206-2 and circuits activated even in the standby state are restricted to the redundancy address buffer 206-1 and the redundancy address comparator 204-1. Thereby, the number of circuits activated even in the standby state decreases, and it is possible to decrease the current to be consumed by the charging or discharging of an internal node corresponding to the change of address signals in the standby state.

The address buffer 206-2 for a normal circuit generates the internal address signals IA0 to IA11 to be supplied to the predecoder 201-1 and mat selector 201-2 in accordance with an address enable signal AE generated by the RAS clock generator 212-1. Because the concrete structure of the redundancy address buffer 206-1 is the same as that of FIG. 3, its description will be omitted. However, the system in which only the non-inverted address signal IAi is supplied to the redundancy address comparator, as in the embodiment shown in FIG. 8 or 9, does not require the inverter circuit N3 for generating the inverted address signal /Ai used for the circuit of the embodiment of FIG. 3.

Figure 13A:
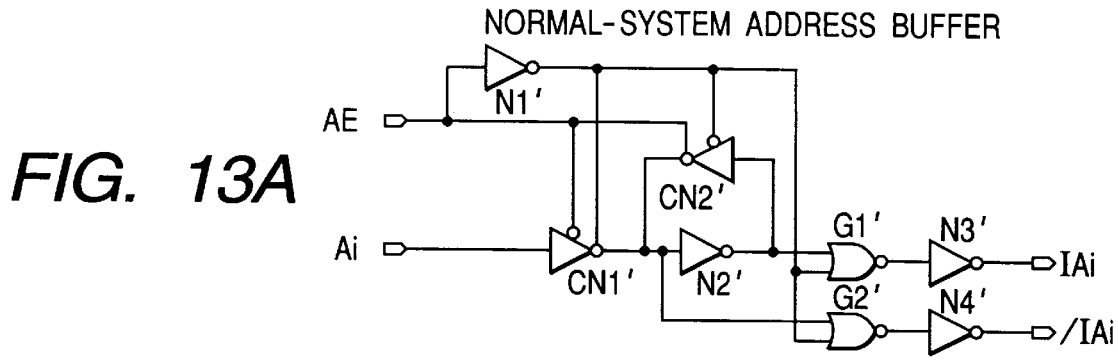
FIGS. 13A to 13D are circuit diagrams showing embodiments of circuit blocks of the system of FIG. 12.
Figure 13B:
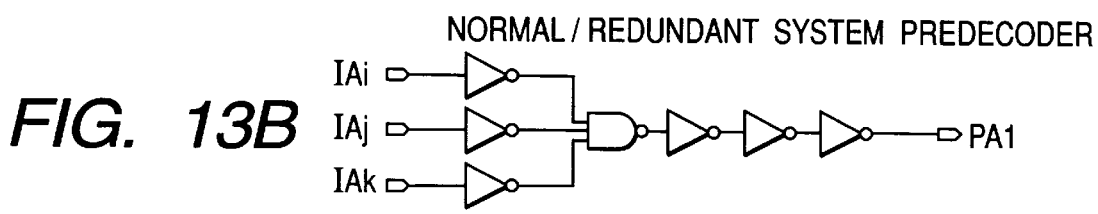
Figure 13C:
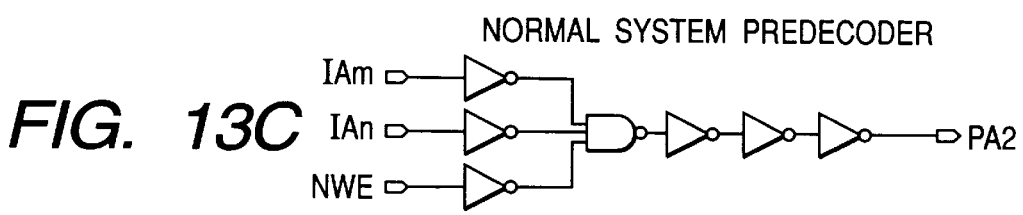

FIGS. 13A, 13B, and 13C are circuit diagrams of embodiments of the circuit blocks of FIG. 12. FIG. 13A is the circuit diagram of the normal-system address buffer (206-2). As described above, the normal-system address buffer performs the operation of latching the address signal Ai and moreover generates the internal address signals IAi and /IAi by opening the gates of gate circuits G1' and G2' in accordance with the address enable signal AE.

Figure 13D:
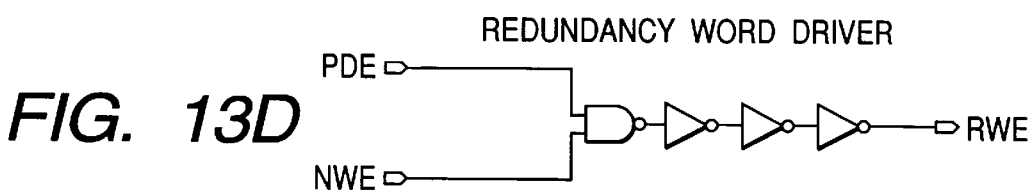

By providing two sets of address buffers as described above, the number of circuit elements in the address buffers increases. However, it is possible to greatly decrease the number of elements of the predecoder circuit. That is, because the above determined internal addresses are supplied to the normal-system/redundant-system predecoder, normal-system predecoder, and redundancy word driver shown in FIGS. 13B, 13C, and 13D, it is possible to omit the above through-latch and the output-gate circuits as shown in FIGS. 4 to 6. In FIG. 13B, the low-order bit of an address is decoded and therefore, the predecoder is activated when any of the normal and redundant system is selected. This predecoder does not have to wait for a redundancy decision. Therefore, when internal address signals IAi, IAj, and IAk are input, the predecoder outputs a predecode signal PA1 before a predecode activation signal is supplied.

The predecoder of FIG. 13C decodes an intermediate-order bit, which is activated only when a normal system is selected. That is, the predecoder is activated only when the normal-system word line start signal NWE is set at a low level. In the case of the three-input predecoder of FIG. 13B, eight circuits are used to generate a total of eight types of predecode signals PA1. In the case of the substantially two-input predecoder of FIG. 13C, four circuits are used to generate four types of predecode signal. Therefore, because the through latch circuit and the output gate circuit of each predecoder can be omitted, the circuit scale is not substantially increased even if the address buffer for a normal circuit described above is used.

Figure 14:
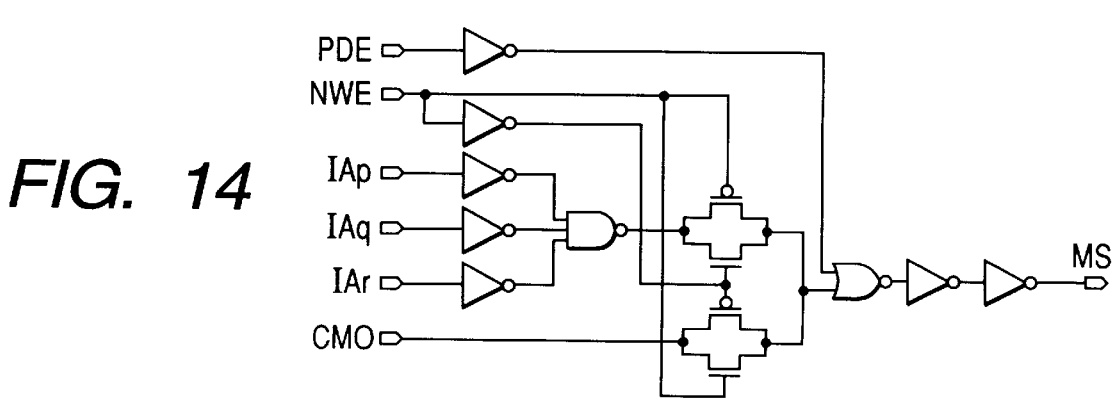
FIG. 14 is a circuit diagram showing an embodiment of the mat selector of FIG. 12.

FIG. 14 is the circuit diagram of an embodiment of a mat selector. A determined internal address signal is also supplied to the mat selector similarly to the predecoders shown in FIGS. 13A, 13B, 13C, and 13D. Therefore, the through-latch circuit and the output-gate circuits used in the embodiment shown in FIG. 7 can be omitted.

Figure 15:
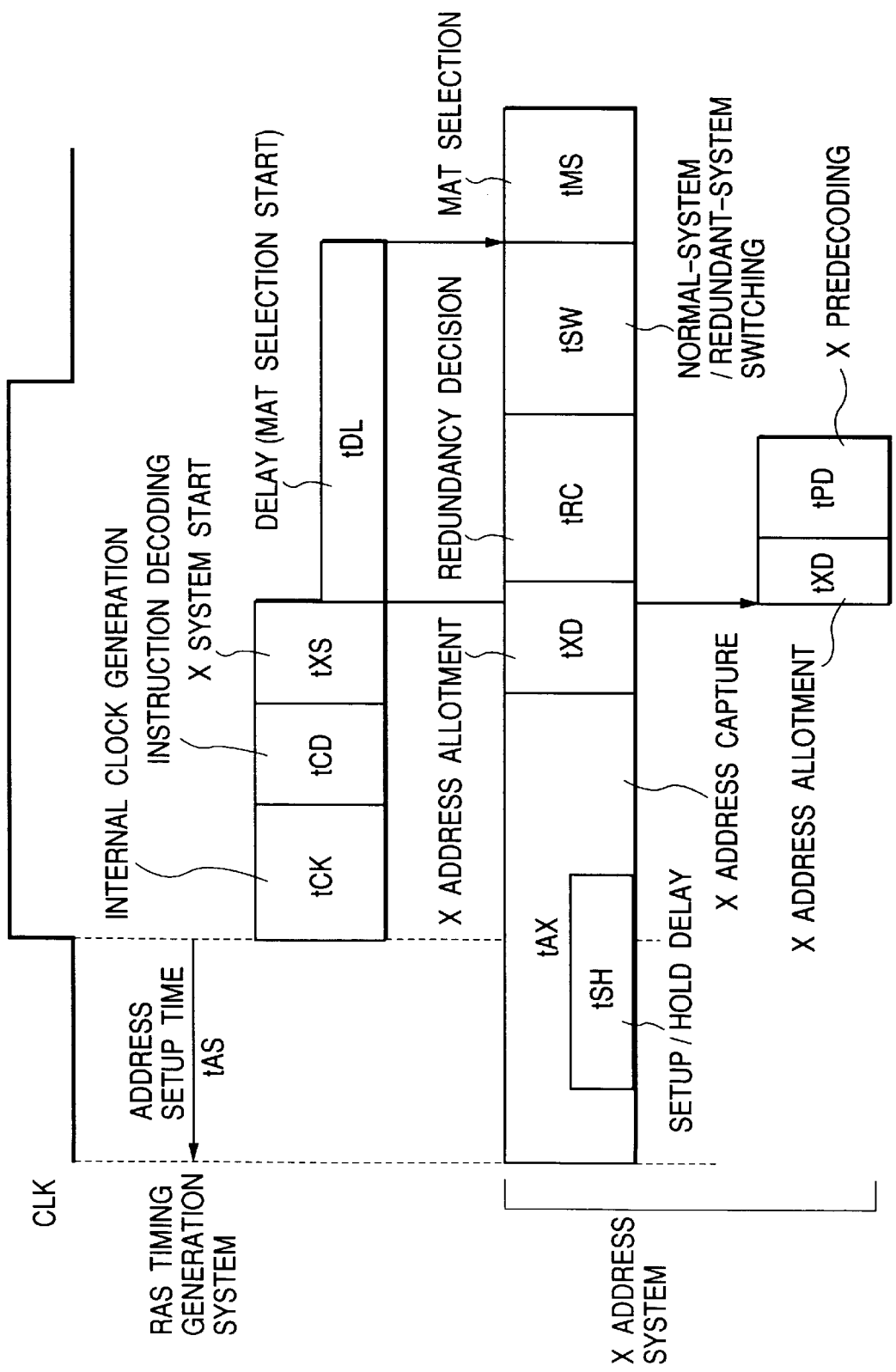
FIG. 15 is a functional diagram illustrating the operation of the redundant system shown in FIG. 12.

FIG. 15 is an explanatory view illustrating the operations of the redundant system shown in FIG. 12. In this illustration, the times from the input to the output of a signal by the circuit blocks of an X-system selector are arranged like a bar chart along the signal transmission path, and the circuit blocks are shown by classifying them into a group of the RAS timing generation system and a group of the X address system, basically similar to the illustration of FIG. 10. However, as described above, the normal-system pre-decoding operation is started after the activation timing receives an X-system start signal from a RAS timing generation system, and X address allotment is performed by the address buffer (206-2). However, because the mat selection speed is determined by the redundancy-decision signal path, the fact that activation of the predecoder is delayed does not delay the word-line selecting operation. That is, when comparing mat selection timings, speed-up is realized similar to the case of FIG. 10.

Figure 16:
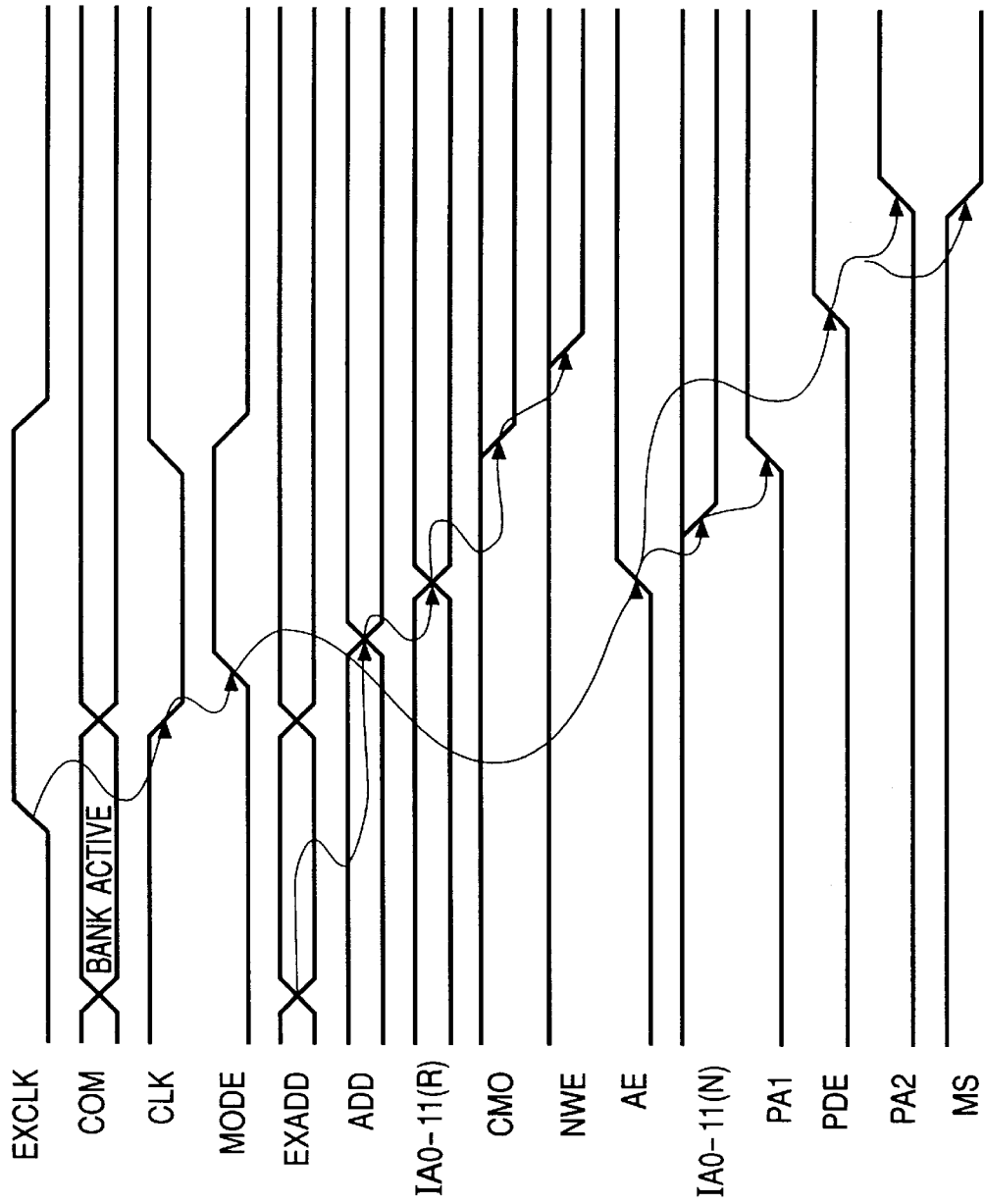
FIG. 16 is a timing chart illustrating the operation of the redundant system of FIG. 12.

FIG. 16 is a timing chart illustrating the operation of the redundant system shown in FIG. 12. The timing chart is basically the same as the timing chart of FIG. 11. However, two address buffers are used as described above and normal-system internal addresses IA0 to IA11 (N) are generated by an address enable signal AE generated by a mode signal MODE corresponding to a bank activation signal. Therefore, the internal addresses IA0 to IA11 are delayed by a period equivalent to the above operation compared to the redundancy internal addresses IA0 to IA11 (R) generated at an early timing similar to the case of FIG. 12. As described above, however, because the mat selection speed is determined by a delay in the redundancy-decision signal path, the fact that the internal addresses IA0 to IA11 (N) of the normal system are generated later and the predecoder output is delayed does not delay the word-line selecting operation.

Figure 17:
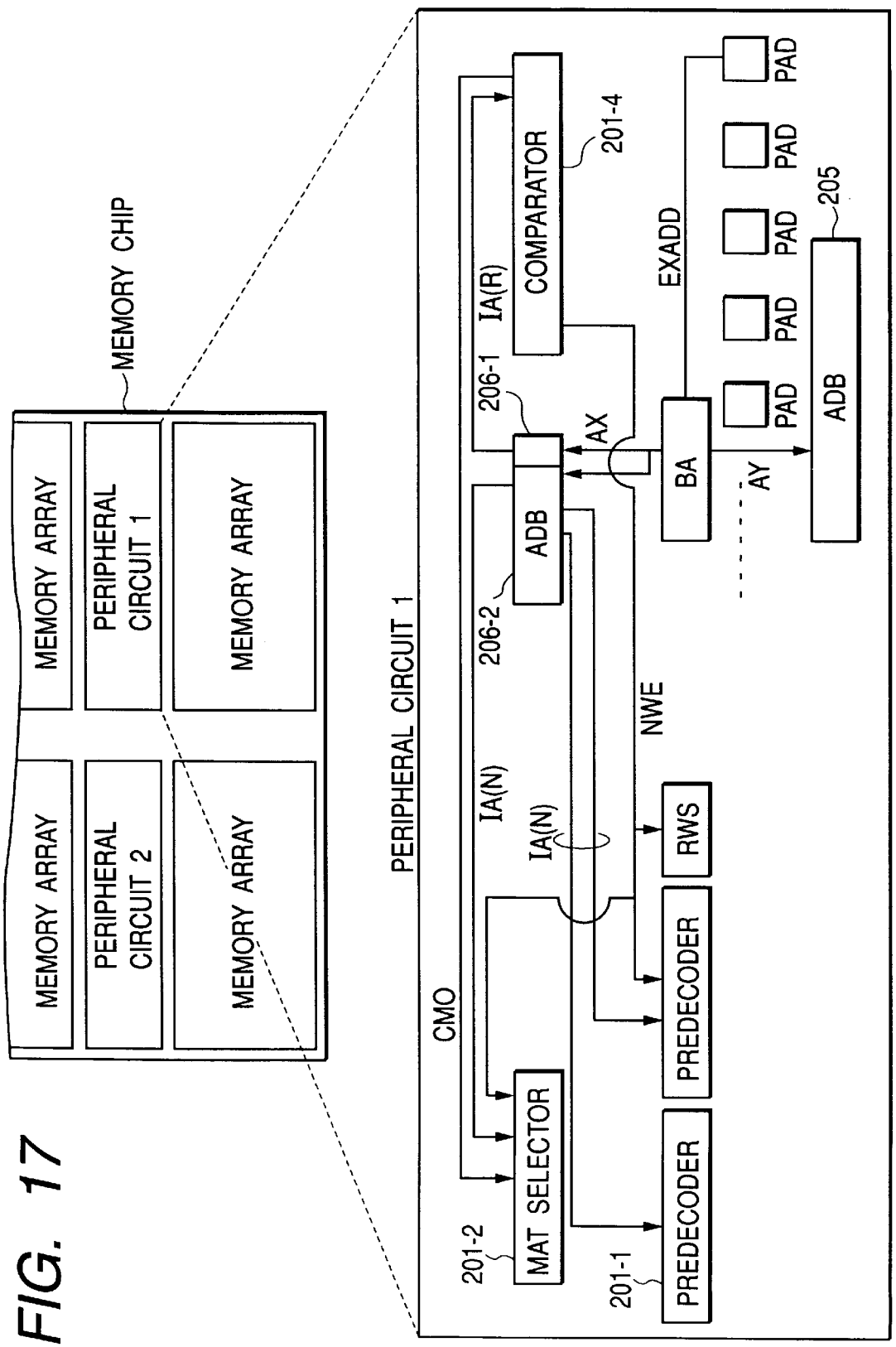
FIG. 17 is a schematic layout diagram showing an embodiment of a dynamic RAM of the present invention.

FIG. 17 is a schematic layout diagram showing an embodiment of a dynamic RAM of the present invention. The memory chip has a memory array divided into four sections as a whole. Peripheral circuits 1 and 2 are arranged at the central portion in the longitudinal direction of the memory chip. An expanded view of the peripheral circuit 1 is shown, wherein, a pad PAd corresponding to an external terminal is connected to the input terminal of an input buffer BA. Though the input buffer is not illustrated, it has a function as a buffer circuit and moreover, switches an internal refresh address and an external address generated by the refresh circuit of FIG. 1.

The output signal AX of the input buffer BA is supplied to the input terminals of the address buffers 206-1 and 206-2. These two address buffers 206-1 and 206-2 are arranged in a straight line so that their one sides are adjacent. The redundancy address comparator 201-4 is provided on the other side of the address buffer 206-1 dedicated to redundancy, and the predecoder 201-1 and mat selector 201-2 are arranged on the other side of the address buffer 206-2.

When using the address buffer 206-1 dedicated to redundancy as in this embodiment, a wiring channel for connecting the output terminal of the buffer 206-1 with the redundancy address comparator is additionally necessary. However, when adjacently arranging the two address buffers 206-1 and 206-2 in a straight line as described above and providing a circuit for receiving output signals of the buffers 206-1 and 206-2 on the other sides, respectively, the wiring channel width is not increased because the wiring channels for transmitting the output signals of the two circuits are arranged almost in a straight line. Thereby, it is possible to prevent the chip area from increasing due to the provision of the two address buffers 206-1 and 206-2.

Figure 18:
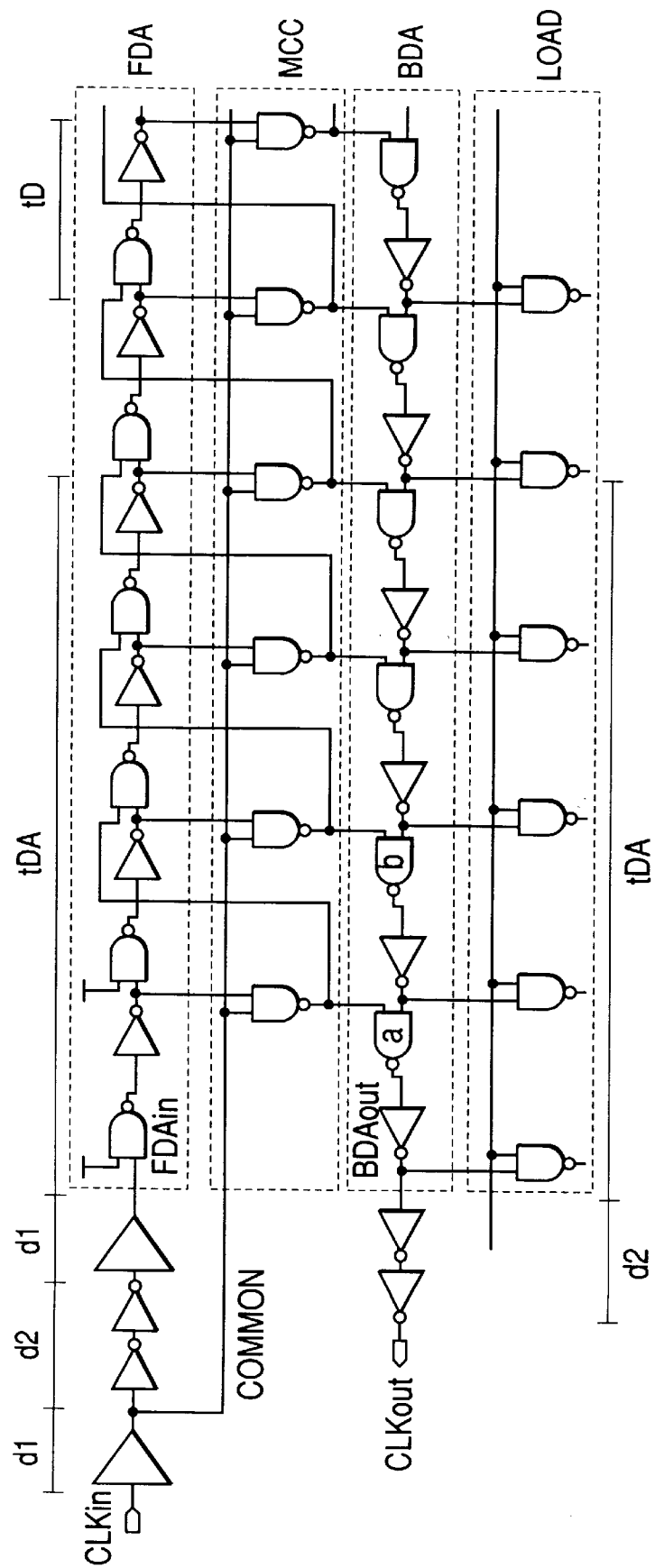
FIG. 18 is a circuit diagram showing an embodiment of a synchronous clock generator used for an SDRAM of the present invention.

FIG. 18 is the circuit diagram of an embodiment of a synchronous clock generator used for an SDRAM of the present invention. In the case of this embodiment, to synchronize the rise of an internal clock CLKout with that of an external clock CLKin which are captured by the SDRAM, the external clock CLKin is input to a forward delay array circuit (hereafter referred to as the FDA) through three delay circuits d1, d2, and d1. Propagation in the FDA of the leading edge of the n-th cycle clock propagating through the FDA is stopped due to the rise of the n+1-th cycle clock propagated as common (hereafter referred to as the COMMON) and the leading edge is transferred to a node in a backward delay array (hereafter referred to as the BDA) present at a position symmetrical to the position where the propagation is stopped.

The leading edge propagates through the BDA in a time equal to the propagation time tDA in the FDA and it is output as the internal clock CLKout through a delay circuit (corresponding to the internal clock driver) of the delay time d2. Because the propagation of the leading edge of the n-th cycle in the FDA is stopped by the leading edge of the signal COMMON of the n+1-th cycle, the following expression (1) is satisfied. In this expression, tCK denotes a cycle time (one cycle) of the clock CLKin.

$$d2+d1+tDA=tCK \qquad (1)$$

The following expression (2) is satisfied when computing the propagation time of the leading edge from the external clock CLKin to the internal clock CLKout along the propagation path. That is, the period from the external clock CLKin to the internal clock CLKout is equal to 2tCK and, thus, the external clock CLKin synchronizes with the internal clock CLKout.

$$d1+d2+d1+tDA+tDA+d\ 2=2(d1+d2+tDA)=2tck \qquad (2)$$

Figure 19:
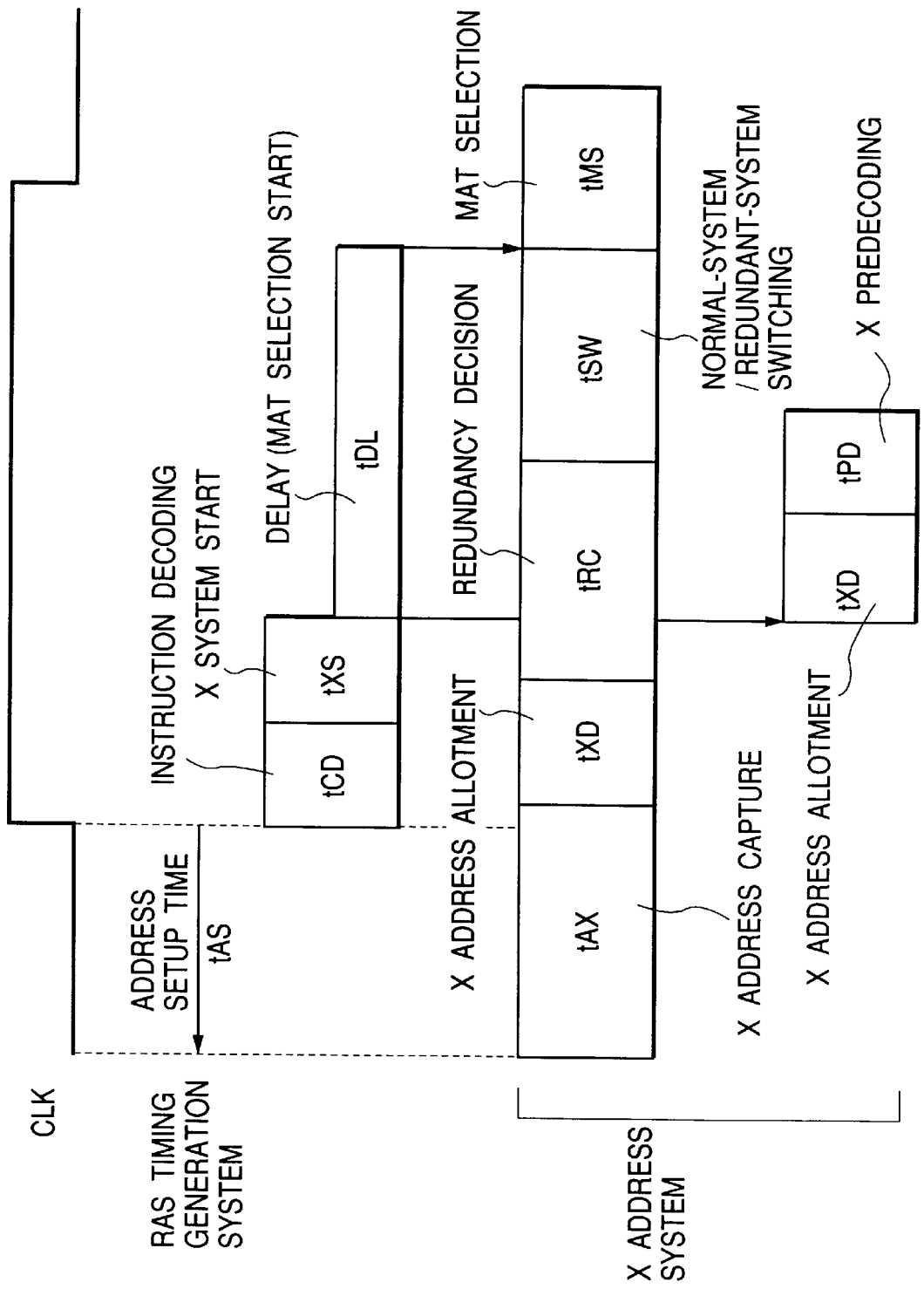
FIG. 19 is a functional diagram illustrating the operation of a redundant system when the synchronous clock generator of FIG. 18 is used.

FIG. 19 shows an explanatory view illustrating the operation of a redundant system when a synchronous generator is used. In the case of this illustration, the delay time tCK for generating an internal clock becomes unnecessary by using the clock synchronization circuit, a RAS timing generation system starts the instruction decoding operation, and the redundant system of the X address system starts the X address allotment tXD simultaneously with the rise of a clock signal CLK. Thereby, it is possible to decrease the time required for the word-line selecting operation by the delay time tCD. Moreover, by arranging an address input pad and a synchronous clock generator so that setup/hold (screw is almost zero) becomes equal for each address signal, it is possible to remove the delay of a setup/hold adjustment circuit, which occupies the half of address capture and is longer than the time required to generate an internal clock signal.

The following operation/working-effects are obtained from the above embodiment.

(1) An X-system selecting operation can be accelerated by bringing into an operating state an X address buffer which captures an X address signal input from an address terminal and generates an internal address signal, and by supplying the internal address signal to a redundancy address comparator comprising a static circuit which detects match/mismatch by comparing the internal address with a stored X-system defective address, and by substantially allowing the starting operation of the redundancy address comparator to precede.

(2) Wasteful current consumption due to the change of internal address signals corresponding to external address signals changed after capturing an X address signal made effective can be reduced by using a through latch circuit for performing the latching operation in accordance with an address capture timing signal generated by the controller.

(3) The redundancy address comparator can be constituted of a small number of elements by using a plurality of pairs of fuse means to whose one ends a plurality of non-inverted and inverted complementary address signals are applied and whose other ends are connected in common and a logic gate circuit for determining that the level of the common connection side of the pairs of fuse means is present at one level.

(4) In the case of a synchronous DRAM for determining the operation mode in accordance with the combination of control signals input synchronously with a clock signal supplied from an external terminal, generating an operation timing signal, and generating a timing signal for inputting or outputting a write signal and read signal synchronously with the clock signal, the X-system selecting operation must be started in correspondence to a plurality of memory banks in accordance with a bank activation signal. Therefore, the significance of acceleration of the X-system selecting operation by a static redundant system of the present invention increases.

(5) Wasteful power consumption in a standby state can be reduced by bringing into an operating state a first X address buffer which captures an X address signal input from an address terminal corresponding to a redundant circuit and generates an internal address signal, supplying the internal address signal to a redundancy address comparator comprising a static circuit which compares the internal address signal with a stored X-system defective address to detect a match/mismatch signal, allows the starting operation of the redundancy address comparator substantially to precede to accelerate the operation, and bringing into an operating state a second X-address buffer which captures the X address signal input from the address terminal corresponding to a normal circuit in accordance with an internal timing signal corresponding to a bank activation signal so as to capture an address signal for the normal circuit.

(6) Wasteful current consumption on the output side of the first X address buffer after a redundancy decision can be reduced by using the first X address buffer as a through latch circuit for performing the latching operation in accordance with an address capture timing signal generated by the controller.

(7) Substantial increase of the wiring channel width can be prevented because the wiring channel for connecting the outputs of first and second address buffers with the inputs of circuits corresponding to the buffers can be separated into right and left portions on both sides of the adjacent point by arranging the two buffers in a straight line so that one end of the buffers are adjacent to each other, providing the redundancy address comparator on the other side of the first address buffer, and providing the predecoder on the other side of the second address buffer.

(8) The X system selecting operation can be further accelerated by delaying a clock signal input from an external terminal by an input stage circuit, providing a forward delay array comprising logic gate circuits constituting a basic delay unit for receiving a pulse signal passing through the input stage circuit and successively propagating output signals of the input stage circuit, inputting the pulse passing through the input stage circuit and the output signal of each logic gate circuit to a mirror controller, transmitting the output of the controller as a gate control signal of a predetermined logic gate of the forward delay array, supplying a pulse edge passing through the mirror control circuit to a backward delay array comprising logic gate circuits constituting the basic delay unit to which a corresponding output signal is supplied from the mirror controller to propagate a pulse edge passing through the mirror controller in the opposite direction to the forward delay array, and generating an internal clock signal whose phase coincides with a clock input from the external terminal two cycles later.

The invention made by the present inventor has been specifically described above with reference to various embodiments. However, the present invention is not restricted to the disclosed embodiments. It is needless to say that various modifications of the present invention are allowed as long as they do not deviate from the gist of the present invention. For example, it is also possible to use a PLL (Phase Locked Loop) circuit or a DLL (Delay Locked Loop) circuit as a synchronous clock generator. Moreover, it is possible to similarly apply the present invention to an asynchronous dynamic RAM in addition to a synchronous DRAM. The asynchronous dynamic RAM is different from the SDRAM only in that an X-system address signal is captured in accordance with the change timing of a low-level /RAS signal. Moreover, when applying the present invention to the asynchronous dynamic RAM, it is possible to embody the present invention by using the setup time of the address signal and thereby allowing a defective address decision in a redundant circuit to precede. Therefore, it is possible to expect acceleration of the X-system selecting operation. The specific structure of a memory array of a dynamic RAM of the present invention can use various embodiments.

An effect obtained from a representative one of the features disclosed in this application will be briefly described below. That is, the X-system selecting operation can be accelerated by capturing an X address signal input from an address terminal to bring an X address buffer for generating an internal address signal into an operation state, by supplying the internal address signal to a redundancy address comparator comprising a static circuit which detects a match/mismatch signal by comparing the internal address with a stored X-system defective address, and by allowing the redundancy address comparator starting operation substantially to precede.

We claim:

1. A dynamic RAM comprising:

an external address terminal to which X- and Y-system address signals are input in time series;

an external clock terminal for receiving a clock signal;

a controller which generates a timing signal necessary for internal operations in accordance with a control signal input synchronously with the clock signal;

an X address buffer which generates an internal address signal by capturing an X address signal input from the external address terminal;

an address comparator including a static circuit which outputs a match/mismatch signal by comparing the internal address signal generated by the X address buffer with an X-system defective address;

a word driver which selects a word line of a normal circuit in accordance with a mismatch signal output from the address comparator; and a redundancy word driver which selects a word line of a redundant circuit in accordance with a match signal output from the address comparator.

2. The dynamic RAM according to claim 1, wherein the X address buffer includes a through latch circuit which performs the latching operation in accordance with an address capture timing signal generated by the controller.

3. The dynamic RAM according to claim 1, wherein the address comparator includes a plurality of pairs of fuses to whose one ends a plurality of inverted and non-inverted complementary address signals are applied and whose other ends are connected in common, and a logic gate circuit which decides that the level of the common connection side of the pairs of fuses is present at one level and a pair of the fuses are selectively blown correspondingly to the defective address.

4. The dynamic RAM according to any one of claims 1, 2, and 3, wherein the controller decides the operation mode in accordance with the combination of control signals input synchronously with the clock signal to generate an operation timing signal, and generates a timing signal for inputting or outputting write and read signals synchronously with the clock signal.

5. A dynamic RAM comprising:

an external address terminal to which X- and Y-system address signals are input in time series;

an external clock terminal for receiving a clock signal;

an external terminal for receiving a control signal;

a controller which generates a timing signal necessary for the internal operations in accordance with the control signal captured synchronously with the clock signal;

a first X address buffer which generates a first internal address signal by capturing an X address signal input from the external address terminal;

a second X address buffer which generates a second internal address signal by receiving an X address signal input from the external address terminal and holding the X address signal in accordance with a timing signal generated by the controller;

a comparator including a static circuit which outputs a match/mismatch signal by comparing the first internal address signal generated by the first X address buffer with a stored X-system defective address;

a word driver which selects a word line of a normal circuit in accordance with a mismatch signal output from the comparator; and a redundancy word driver which selects a word line of a redundant circuit in accordance with a match signal output from the comparator.

6. The dynamic RAM according to claim 5, wherein the first X address buffer includes a through latch circuit which performs the latching operation in accordance with an address capture timing signal generated by the controller.

7. The dynamic RAM according to claim 5, wherein the comparator includes a plurality of pairs of fuses to whose one ends a plurality of inverted and non-inverted complementary address signals are applied and whose other ends are connected in common, and a logic gate circuit which decides that the level of the common connection side of the pairs of fuses is present at one level and a pair of the fuses are selectively blown correspondingly to the defective address.

8. The dynamic RAM according to any one of claims 5, 6, and 7, wherein the controller decides the operation mode in accordance with the combination of control signals input synchronously with the clock signal to generate an operation timing signal, and generates a timing signal for inputting or outputting read and write signals synchronously with the clock signal.

9. The dynamic RAM according to claim 8, wherein the first and second address buffers are arranged in a straight line so that one ends of the buffers are adjacent to each other and the comparator is provided on the other side of the first buffer.

10. The dynamic RAM according to claim 4 or 8, wherein the clock signal is generated by a synchronous clock generator comprising:

an input stage circuit which delays a clock input from an external terminal, a first delay circuit including AND gate circuits constituting a basic delay unit which receives pulse signals passing through the input stage circuit and successively propagates the output signals, a mirror controller which receives a pulse passing through the input stage circuit and an output signal of each AND gate circuit and transmitting the outputs as the gate control signal of a predetermined AND gate of the first delay circuit, and a second delay circuit including AND gate circuits constituting a basic delay unit to which an output signal is supplied from the mirror control circuit and which propagates a pulse edge passing through the mirror control circuit in the direction opposite to that of the first delay circuit, wherein the phase of a clock signal output from the second delay circuit coincides with that of a clock input from the external terminal two cycles later.

11. The dynamic RAM according to claim 4 or 8, further comprising a synchronous clock generator which receives the clock signal and generates an internal clock signal whose phase coincides with that of the clock signal, wherein the control circuit operates synchronously with the internal clock signal.

12. The dynamic RAM according to claim 4 or 8, wherein the clock signal is generated by an input stage circuit for delaying a clock input from an external terminal, a forward delay array including AND gate circuits having a basic delay unit which receives pulse signals passing through the input stage circuit and successively propagates the output signals, a mirror controller which receives a pulse passing through the input stage circuit and the output signal of each AND gate circuit and transmits the outputs as the gate control signal of a predetermined AND gate of the first delay circuit, and a synchronous clock generator including a backward delay array including AND gate circuits constituting a basic delay unit to which an output signal is supplied from the mirror control circuit and propagates a pulse edge passing through the mirror control circuit in the direction opposite to that of the forward delay array, and wherein the phase of a clock signal output from the backward delay array coincides with that of a clock input from the external terminal two cycles later.

13. A dynamic RAM comprising:

an address terminal to which an X-system address signal and a Y-system address signal are input in time series;

a control circuit which generates a timing signal necessary for internal operations in accordance with a control signal supplied from an external terminal;

an X address buffer which generates an internal address signal by capturing an X address signal input from the address terminal;

a redundancy address comparator including a static circuit which detects a match/mismatch signal by receiving internal address signal generated by the X address buffer and compares the internal address signal with a stored X-system defective address;

a predecoder which generates a predecode signal by receiving an internal address signal generated by the X address buffer and holds the predecode signal in accordance with an operation timing signal generated by the control circuit;

a word driver which selects a word line of a normal circuit in accordance with the combination of the predecode signals and the combination of mismatch signals supplied from the address comparator; and a redundancy word driver which selects a word line of a redundant circuit in accordance with a match signal supplied from the address comparator.

14. The dynamic RAM according to claim 13, wherein the X address buffer includes a through latch circuit which performs the latching operation in accordance with an address capture timing signal generated by the control circuit.

15. The dynamic RAM according to claim 13, wherein the redundancy address comparator includes a plurality of pairs of fuses to whose one ends a plurality of non-converted and converted complementary address signals are applied and whose other ends are connected in common, and a logic gate circuit for deciding that the level of the common connection side of the fuses is present at one level and a pair of the fuses are selectively blown correspondingly to the defective address.

16. The dynamic RAM according to any one of claims 13, 14, and 15, wherein the control circuit decides the operation mode in accordance with the combination of control signals input synchronously with a clock signal supplied from an external terminal to generate an operation timing signal, and generate a timing signal for inputting or outputting write and read signals synchronously with the clock signal.

17. A dynamic RAM comprising:

an address terminal to which an X-system address signal and a Y-system address signal are input in time series;

a control circuit which generates a timing signal necessary for internal operations in accordance with a control signal supplied from an external terminal;

a first X address buffer which generates a first internal address signal by capturing the X address signal input from the address terminal;

a second X address buffer which generates a second internal address signal by receiving an X address signal input from the address terminal and holds the X address signal in accordance with a timing signal generated by the control circuit;

a redundancy address comparator including a static circuit which detects a match/mismatch signal by receiving a first internal address signal generated by the first X address buffer and compares the address signal with a stored X-system defective address;

a predecoder which generates a predecode signal by receiving a second internal address signal generated by the second X address buffer;

a word driver which selects a word line of a normal circuit in accordance with the combination of the predecode signals and the combination of mismatch signals supplied from the address comparator; and a redundancy word driver which selects a word line of a redundant circuit in accordance with a match signal supplied from the address comparator.

18. The dynamic RAM according to claim 17, wherein the first X address buffer includes a through latch circuit which performs the latching operation in accordance with an address capture timing signal generated by the control circuit.

19. The dynamic RAM according to claim 17, wherein the redundancy address comparator includes a plurality of pairs of fuses to whose one ends a plurality of non-converted and converted complementary address signals are applied and whose other ends are connected in common, and a logic gate circuit which decides that the level of the common connection side of the fuses is present at one level and a pair of the fuses are selectively blown correspondingly to the defective address.

20. The dynamic RAM according to any one of claims 17, 18, and 19, wherein the control circuit decides the operation mode in accordance with the combination of control signals input synchronously with a clock signal supplied from an external terminal to generate an operation timing signal, and generate a timing signal for inputting or outputting write and read signals synchronously with the clock signal.

21. The dynamic RAM according to claim 20, wherein the first and second address buffers are arranged in a straight ling so that one ends of the buffers are adjacent to each other, the redundancy address comparator is provided to the other side of the first address buffer, and the predecoder is provided to the other side of the second address buffer.

22. The dynamic RAM according to claim 16 or 20, wherein a synchronous clock generator which generates an internal clock signal whose phase coincides with that of a clock signal supplied from the external terminal is included, and the control circuit operates synchronously with the internal clock signal.

* * * * *